(12) United States Patent
    Haneda

(10) Patent No.: US 10,122,377 B2
(45) Date of Patent: *Nov. 6, 2018

(54) COMPARATOR, CIRCUIT DEVICE, PHYSICAL QUANTITY SENSOR, ELECTRONIC DEVICE, AND VEHICLE

(71) Applicant: Seiko Epson Corporation, Tokyo (JP)

(72) Inventor: Hideo Haneda, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/848,269

(22) Filed: Dec. 20, 2017

(65) Prior Publication Data

US 2018/0115319 A1    Apr. 26, 2018

Related U.S. Application Data

(63) Continuation of application No. 15/650,037, filed on Jul. 14, 2017, now Pat. No. 9,882,578.

(30) Foreign Application Priority Data

Jul. 25, 2016    (JP) ................ 2016-145092

(51) Int. Cl.
    *H03M 1/50*    (2006.01)
    *H03K 5/24*    (2006.01)
    *H03M 1/12*    (2006.01)
    *H03K 9/08*    (2006.01)
    *H03M 1/46*    (2006.01)
    *H03F 3/45*    (2006.01)

(52) U.S. Cl.
    CPC .......... *H03M 1/50* (2013.01); *H03F 3/45475* (2013.01); *H03K 5/249* (2013.01); *H03K 9/08* (2013.01); *H03M 1/1245* (2013.01); *H03M 1/46* (2013.01)

(58) Field of Classification Search
    CPC ........ H03M 1/50; H03M 1/1245; H03M 1/46; H03M 1/00; H03K 5/249; H03K 9/08; H03K 5/22; H03K 5/26; H03K 5/14; H03F 3/45475; H03F 3/45071; G04F 10/04
    USPC ........ 341/166, 155; 327/2, 3, 12, 50, 63, 64, 327/104, 77, 78, 141
    See application file for complete search history.

(56) References Cited

U.S. PATENT DOCUMENTS

| | | | |
|---|---|---|---|
| 5,396,247 A * | 3/1995 | Watanabe | G04F 10/005 341/157 |
| 6,850,178 B2 * | 2/2005 | Watanabe | G04F 10/005 341/129 |
| 7,106,239 B1 | 9/2006 | Keskin | |

(Continued)

*Primary Examiner* — Jean B Jeanglaude
(74) *Attorney, Agent, or Firm* — Harness, Dickey & Pierce, P.L.C.

(57) ABSTRACT

A comparator includes a first voltage-time conversion circuit, a second voltage-time conversion circuit, and a determination circuit. A first delay unit includes a first primary conductivity type transistor of which current is controlled based on a first input signal, a first secondary conductivity type transistor of which current is controlled based on a second input signal, and a first delay buffer provided between the transistors. A second delay unit includes a second primary conductivity type transistor of which current is controlled based on a second input signal, a second secondary conductivity type transistor of which current is controlled based on a first input signal, and a second delay buffer provided between the transistors.

20 Claims, 16 Drawing Sheets

(56) References Cited

U.S. PATENT DOCUMENTS

| | | |
|---|---|---|
| 7,274,221 B2 | 9/2007 | Kim |
| 7,916,064 B2 | 3/2011 | Lin et al. |
| 8,373,444 B2 | 2/2013 | Lee et al. |
| 8,957,712 B2 | 2/2015 | Tang et al. |

* cited by examiner

COMPARATOR, CIRCUIT DEVICE, PHYSICAL QUANTITY SENSOR, ELECTRONIC DEVICE, AND VEHICLE

CROSS-REFERENCE TO RELATED APPLICATIONS

This application is a continuation of U.S. patent application Ser. No. 15/650,037 filed on Jul. 14, 2017, which claims priority to Japanese Patent Application No. 2016-145092, filed Jul. 25, 2016, both of which are hereby expressly incorporated by reference herein in their entireties.

BACKGROUND

1. Technical Field

The present invention relates to a comparator, a circuit device, a physical quantity sensor, an electronic device, a vehicle, or the like.

2. Related Art

A time-domain type comparator is known which converts an input voltage level into a time (for example, a delay time of a signal edge, a pulse width of a pulse signal, a period of a clock signal, or the like), and performs comparison of the input voltage level by comparison of the time.

For example, U.S. Pat. No. 8,373,444 discloses a time domain-type comparator, and a sequential comparison-type A/D converter using it. The time domain-type comparator of U.S. Pat. No. 8,373,444 includes first and second voltage-time conversion circuits to which first and second input voltages and clock signals are input, and compares the first and second input voltages by comparing delay times (first and second delay times) of the clock signals in the first and second voltage-time conversion circuits. The first voltage-time conversion circuit includes a plurality of delay stages, and each delay stage includes two stages of inverter. An N-type transistor is provided between a first-stage inverter and a ground, and a P-type transistor is provided between a second-stage inverter and a power supply. Then, a first input voltage is input to the N-type transistor, and a second input voltage is input to the P-type transistor. The second voltage-time conversion circuit has the same configuration, but the second input voltage is input to the N-type transistor and the first input voltage is input to the P-type transistor. With such a configuration, the magnitude relation of the first and second delay times are determined according to the magnitude relation of the first and second input voltages, and voltage comparison is possible.

In the time domain-type comparator as described above, the delay time (a gain for converting a voltage into a time) is determined by the number of delay stages, and there is a problem in that a layout area is required by the number of delay stages. For example, in order to increase the delay time, it is necessary to increase the number of delay stages and thus the layout area increases.

For example, since U.S. Pat. No. 8,373,444 is configured such that only one edge of the clock signal is delayed, the number of stages needs to be increased in order to increase the delay time. That is, in a case where one edge (a rising edge) is input to a plurality of delay stages and the edge is delayed, the next input edge is necessarily the other edge (a falling edge). Therefore, even if the outputs of a plurality of delay stages are fed back to the input side to attempt to repeatedly perform delay, the falling edge of the second round cannot be delayed. That is, since it is not possible to feedback the outputs of a plurality of delay stages back to the input side and to repeatedly perform delay, it is necessary to increase the number of stages in order to increase the delay time.

SUMMARY

An advantage of some aspects of the invention is to provide a comparator, a circuit device, a physical quantity sensor, an electronic device, a vehicle, and the like, which can reduce a layout area while securing a delay time.

The invention can be implemented as the following forms or embodiments.

An aspect of the invention relates to a comparator including a first voltage-time conversion circuit which includes a first delay circuit, and to which a first input signal and a second input signal are input, a second voltage-time conversion circuit which includes a second delay circuit, and to which the first input signal and the second input signal are input, and a determination circuit that determines magnitude relation of the first input signal and the second input signal, based on an output signal of the first voltage-time conversion circuit and an output signal of the second voltage-time conversion circuit, in which a first delay unit included in the first delay circuit, includes a first primary conductivity type transistor of which current is controlled based on the first input signal, a first secondary conductivity type transistor of which current is controlled based on the second input signal, and a first delay buffer which is provided between the first primary conductivity type transistor and the first secondary conductivity type transistor, and which delays and outputs an input signal of the first delay unit, and in which a second delay unit included in the second delay circuit, includes a second primary conductivity type transistorprimary conductivity type transistor of which current is controlled based on the second input signal, a second secondary conductivity type transistorsecondary conductivity type transistor of which current is controlled based on the first input signal, and a second delay buffer which is provided between the second primary conductivity type transistor and the second secondary conductivity type transistor, and which delays and outputs an input signal of the second delay unit.

According to the aspect of the invention, each of the first delay buffer and the second delay buffer is provided between the primary conductivity type transistor and the secondary conductivity type transistor. The first input signal or the second input signal of the comparator is input to the gate of each transistor, and the current flowing through the transistor is controlled based on the first input signal or the second input signal. Thus, the first delay buffer and the second delay buffer can delay both the rising edge and the falling edge. Since the delay circuit can delay both edges, one edge is delayed, and then the output is fed back to the input side so as to be able to delay the other edge. This makes it possible for the delay circuit to delay edges a plurality of times, thereby reducing the layout area while ensuring the delay time.

In the aspect of the invention, a delay circuit of each of the first delay circuit and the second delay circuit may include a plurality of delay units connected in series.

In this way, each delay circuit includes a plurality of delay units, such that the gain for converting the voltage to time can be increased.

In the aspect of the invention, in the first delay circuit, the first primary conductivity type transistor and the first secondary conductivity type transistor may be shared between at least two delay units of the plurality of delay units, and in the second delay circuit, the second primary conductivity type transistor and the second secondary conductivity type transistor may be shared between at least two delay units of the plurality of delay units.

With this configuration, one delay unit of two delay units uses one of the primary conductivity type transistor and the secondary conductivity type transistor, and the other delay unit uses the other one of the primary conductivity type transistor and the secondary conductivity type transistor. Thus, the primary conductivity type transistor and the secondary conductivity type transistor which control the delay are effectively used, and the layout area can be further reduced.

In the aspect of the invention, in a case where a determination result of the determination circuit is confirmed, power supply voltages to be supplied to the first delay buffer and the second delay buffer may be set to a predetermined voltage.

Since the delay buffer is provided between the primary conductivity type transistor and the secondary conductivity type transistor, the edge of the output signal of the delay buffer gradually changes. Then, at the next comparison by the comparator, the output signal of the delay buffer does not start from the power supply level, so there is a possibility that a sufficient delay does not occur. In this regard, according to the aspect of the invention, in a case where a determination result of the determination circuit is confirmed, the power supply voltages to be supplied to the delay buffer are set to a predetermined voltage, such that a next comparison by the comparator can be started from the state where the output signals of the delay buffers reach the power supply level.

In the aspect of the invention, in the first delay buffer, a delay time may be controlled based on a current flowing through any one of the first primary conductivity type transistor and the first secondary conductivity type transistor, and in the second delay buffer, a delay time may be controlled based on a current flowing through any one of the second primary conductivity type transistor and the second secondary conductivity type transistor.

According to the aspect of the invention with this configuration, at each edge, the delay time is controlled based on the current flowing through any one of the primary conductivity type transistor and the secondary conductivity type transistor. By providing both the primary conductivity type transistor and the secondary conductivity type transistor in the delay buffer, it is possible to control the delay time at both edges.

In the aspect of the invention, the first voltage-time conversion circuit may further include a first input signal generation circuit that generates an input signal of the first delay circuit, and a first latch circuit that operates based on an output signal of the first delay circuit, and the second voltage-time conversion circuit may further include a second input signal generation circuit that generates an input signal of the second delay circuit, and a second latch circuit that operates based on an output signal of the second delay circuit.

According to the aspect of the invention with this configuration, the first edge propagating through the delay circuit is fed back to the input of the delay circuit as the second edge by the input signal generation circuit. An edge obtained by two rounds by the delay circuit is latched by the latch circuit. In this way, since the edge makes two rounds of the delay circuit, the number of stages of the delay units can approximately be halved while maintaining the delay time.

In the aspect of the invention, the first input signal generation circuit may change an input signal of the first delay circuit from a first logic level to a second logic level, and change an input signal of the first delay circuit from the second logic level to the first logic level, in a case where an output signal of the first delay circuit changes from the first logic level to the second logic level, in which in the first latch circuit, an output signal may change from the second logic level to the first logic level, in a case where an output signal of the first delay circuit changes from the second logic level to the first logic level, in which the second input signal generation circuit may change an input signal of the second delay circuit from the first logic level to the second logic level, and change an input signal of the second delay circuit from the second logic level to the first logic level, in a case where an output signal of the second delay circuit changes from the first logic level to the second logic level, and in which in the second latch circuit, an output signal may change from the second logic level to the first logic level, in a case where an output signal of the second delay circuit changes from the second logic level to the first logic level.

According to the aspect of the invention with this configuration, after the input signal generation circuit changes the input signal of the delay circuit from the first logic level to the second logic level, the edge makes two rounds of the delay circuit, and after the delay time of two rounds, the logic level of the output signal of the latch circuit changes and the logic level of the output signal of the delay circuit changes. In this way, the edge can make two rounds of the delay circuit.

In the aspect of the invention, the first voltage-time conversion circuit may further include a first measurement circuit that measures the number of pulses of an output signal from the first delay circuit, an output signal of the first voltage-time conversion circuit may be generated based on a measurement result of the first measurement circuit, the second voltage-time conversion circuit may further include a second measurement circuit that measures the number of pulses of an output signal from the second delay circuit, and an output signal of the second voltage-time conversion circuit may be generated based on a measurement result of the second measurement circuit.

In the aspect of the invention with this configuration, the frequency (the number of pulses per unit time) of the output signal from the delay circuit changes with the delay time according to the first input signal and the second input signal. Therefore, it is possible to determine the magnitude relation of the first input signal and the second input signal based on the number of pulses of the output signal from the delay circuit.

In the aspect of the invention, the first voltage-time conversion circuit may further include a first ring oscillator which includes the first delay circuit, and in which an output signal of the first delay circuit is fed back to an input signal, and the second voltage-time conversion circuit may further include a second ring oscillator which includes the second delay circuit, and in which an output signal of the second delay circuit is fed back to the input signal.

In this way, by configuring a ring oscillator including a delay circuit, the oscillation frequency of the ring oscillator changes according to the first input signal and the second input signal. Thus, it is possible to determine the magnitude relation of the first input signal and the second input signal based on the number of pulses of the output signal from the delay circuit.

In the aspect of the invention, the first voltage-time conversion circuit may further include a third input signal generation circuit that receives an enable signal and a signal based on an output signal of the first delay circuit, and generate an input signal of the first delay circuit, and the second voltage-time conversion circuit may further include a fourth input signal generation circuit that receives the enable signal and a signal based on an output signal of the second delay circuit, and generate an input signal of the second delay circuit.

With this configuration, it is possible to configure a first ring oscillator in which the output signal of the first delay circuit is fed back to the input signal and a second ring oscillator in which the output signal of the second delay circuit is fed back to the input signal.

Another aspect of the invention relates to a circuit device including the comparator according to any one of the above.

Still another aspect of the invention relates to a physical quantity sensor including the circuit device according to the above.

Still further another aspect of the invention relates to an electronic device including the circuit device according to the above.

Still further another aspect of the invention relates to a vehicle including the circuit device according to the above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. It is to be noted that the embodiment described below does not unduly limit the contents of the invention described in the appended claims, and not all of the configurations described in the embodiment are necessarily indispensable as solutions of the invention.

1. Configuration

A comparator in the related art is commonly a comparator (for example, a latch comparator, or the like) that directly compares voltages (without converting the voltage into another amount such as a time). When such a comparator attempts to determine a weak signal, a preamplifier is provided in front of the comparator to amplify an input signal, and the comparator compares the amplified signal. Since it is necessary to apply a bias current to the preamplifier and the comparator, power consumption increases.

For example, when the above comparator is applied to the sequential comparison A/D conversion circuit as illustrated later in FIG. 18, the comparator occupies most of the power consumption. In the sequential comparison, the comparator performs comparison of a minute voltage difference, for example, by comparison of a bit close to LSB, or the like. Since the comparator has a dead zone (a range of an input voltage where a high level or a low level is stochastically determined), the comparator performs comparison after the preamplifier amplifies the voltage such that the voltage difference becomes larger than the dead zone. Therefore, the power consumption of the preamplifier tends to increase. In a case where the voltage difference to be compared by the sequential comparison-type comparator is large, the comparator is overspecified, but the preamplifier has to be designed according to the minimum voltage difference.

In the embodiment, in order to solve the above problem, a voltage-time conversion type comparator is adopted. That is, an input voltage is converted into time (a time difference in an edge) and comparison is made in that time domain. In this method, a comparator can be realized by a digital operation, so that a bias current is not necessary and low power consumption can be achieved. A comparator of the embodiment will be described below.

Figure 1:
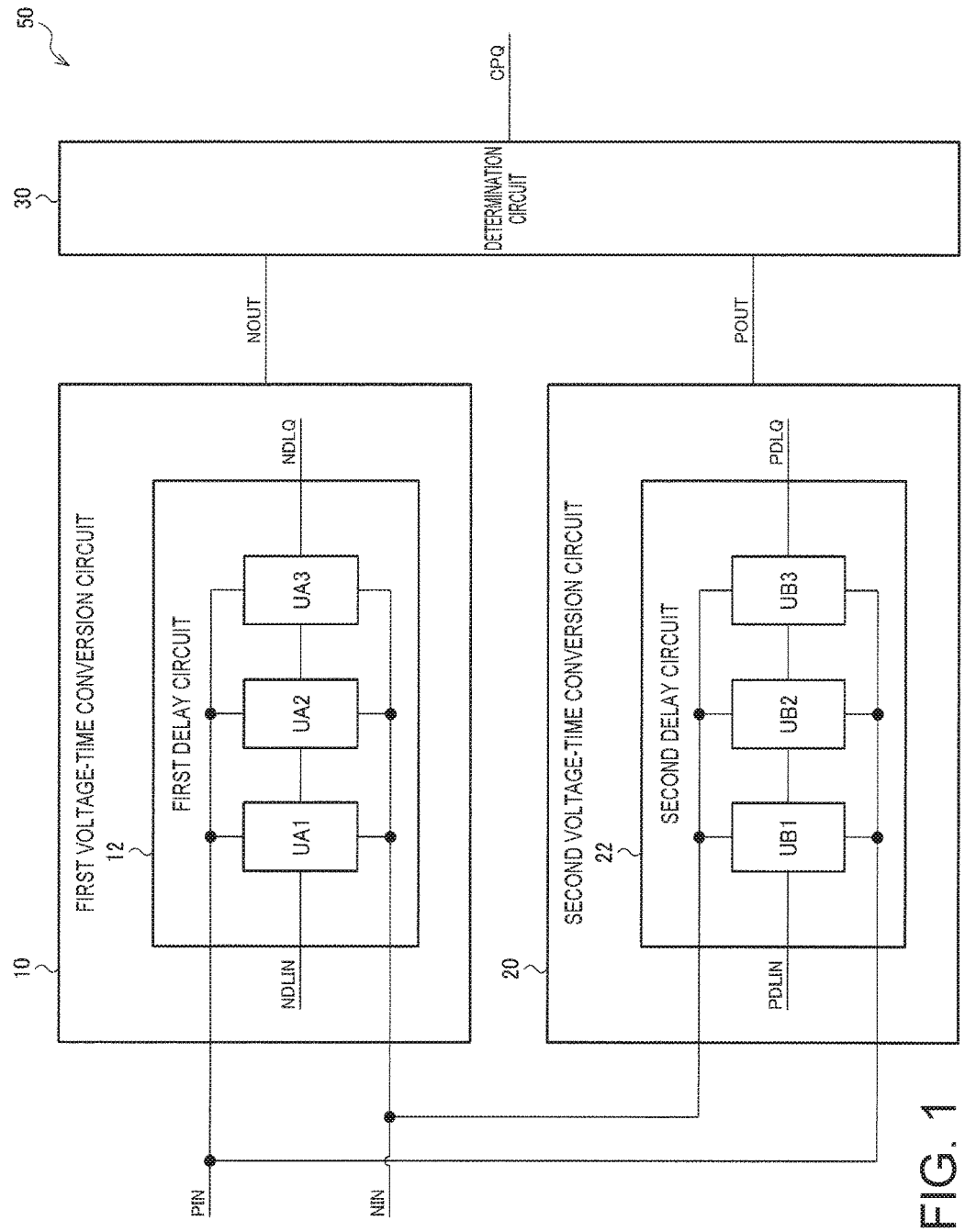
FIG. 1 shows a configuration example of a comparator of the embodiment.
Figure 2:
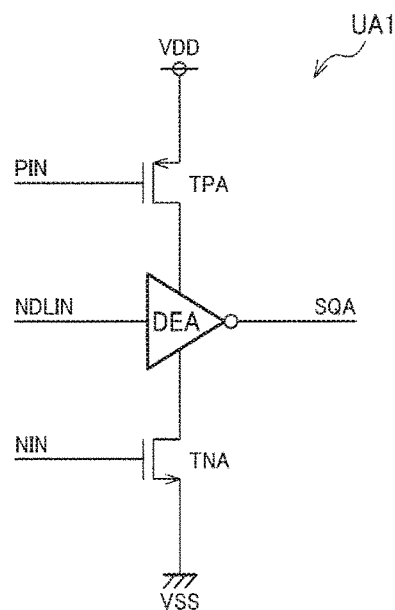
FIG. 2 shows a configuration example of a first delay unit.
Figure 3:
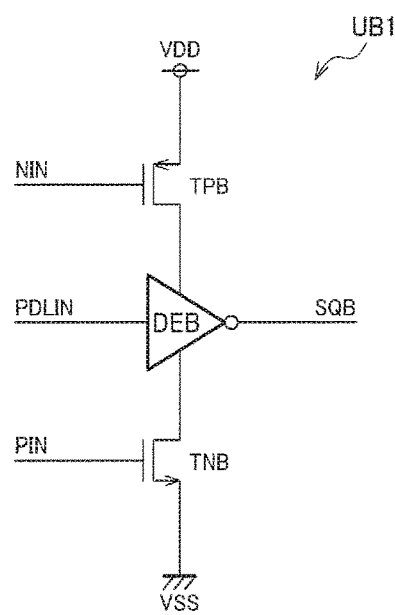
FIG. 3 shows a configuration example of a second delay unit.

FIG. 1 shows a configuration example of a comparator 50 of the embodiment. FIG. 2 shows the configuration example of a delay unit UA1, and FIG. 3 shows the configuration example of a delay unit UB1. The comparator 50 includes a first voltage-time conversion circuit 10, a second voltage-time conversion circuit 20, and a determination circuit 30.

A first voltage-time conversion circuit 10 receives a first input signal PIN and a second input signal NIN, and includes a first delay circuit 12. A second voltage-time conversion circuit 20 receives the first input signal PIN and the second input signal NIN, and includes a second delay circuit 22. The determination circuit 30 determines the magnitude relation of the first input signal PIN and the second input signal NIN, based on the output signal NOUT of the first voltage-time conversion circuit 10 and the output signal POUT of the second voltage-time conversion circuit 20.

The first delay circuit 12 includes a delay unit UA1 (a first delay unit). The delay unit UA1 includes a first primary conductivity type transistor TPA of which current is controlled based on the first input signal PIN, a first secondary conductivity type transistor TNA of which current is controlled based on the second input signal NIN, and a first delay buffer DEA which is provided between the first primary conductivity type transistor TPA and the first secondary conductivity type transistor TNA and delays and outputs the input signal NDLIN of the delay unit UA1.

The second delay circuit 22 includes a delay unit UB1 (a second delay unit). The delay unit UB1 includes a second primary conductivity type transistor TPB of which current is controlled based on the second input signal NIN, a second secondary conductivity type transistor TNB of which current is controlled based on the first input signal PIN, and a second delay buffer DEB which is provided between the second primary conductivity type transistor TPB and the second secondary conductivity type transistor TNB and delays and outputs the input signal PDLIN of the delay unit UB1.

FIG. 1 shows a case where the delay circuits 12 and 22 respectively include a plurality of delay units UA1 to UA3, and UB1 to UB3, but without being limited thereto, the delay circuits 12 and 22 each may include one or a plurality of delay units. Further, the number of the plurality of delay units is arbitrary regardless of odd number or even number. FIGS. 2 and 3 respectively shows the delay units UA1 and UB1, the delay units UA2 and UA3 can be configured in the same manner as the delay unit UA1, and the delay units UB2 and UB3 can be configured in the same manner as the delay unit UB1.

Here, the first input signal PIN and the second input signal NIN are the voltages (an input voltage, a comparison voltage) to be compared by the comparator 50.

Further, the input signal NDLIN of the first delay circuit 12 and the input signal PDLIN of the second delay circuit 22 are signals having at least one edge (a change in a logical level). The signals NDLIN and PDLIN may be supplied from the outside of the voltage-time conversion circuits 10 and 20 or may be generated inside the voltage-time conversion circuits 10 and 20. For example, digital signals such as clock signals may be input as the signals NDLIN and PDLIN from the outside of the voltage-time conversion circuits 10 and 20. Alternatively, the output signals NDLQ and PDLQ of the delay circuits 12 and 22 may be processed by the logic circuits inside the voltage-time conversion circuits 10 and 20, and fed back as the signals NDLIN and PDLIN.

The output signal NOUT of the first voltage-time conversion circuit 10 is a signal based on the output signal NDLQ of the first delay circuit 12, and the output signal POUT of the second voltage-time conversion circuit 20 is a signal based on the output signal PDLQ of the second delay circuit 22. For example, the signals NDLQ and PDLQ may be directly output as the signals NOUT and POUT. Alternatively, the signals NDLQ and PDLQ may be input to a logic circuit such as a latch circuit or a counter, and the signals processed by the logic circuit may be output as the signals NOUT and POUT.

Further, the control of the current based on the input signals PIN and NIN means that signals based on the input signals PIN and NIN are input to the gate of the transistor, and a current (a drain current) flowing through the transistor is controlled depending on the voltage level of the signals input to the gate. That is, the transistors TPA and TPB control the current flowing from the power supply VDD (a high potential side power supply) to the high potential side power supply node of the delay buffers DEA and DEB based on the input signals PIN and NIN. The transistors TNA and TNB control the current flowing from the low potential side power supply node of the delay buffers DEA and DEB to the power supply VSS (a low potential side power supply, for example, ground) based on the input signals PIN and NIN. Note that the input signals PIN and NIN may be directly input to the gate of the transistor, or the input signals PIN and NIN may be input to a circuit such as a buffer and the output signal of the circuit may be input to the gate of the transistor.

In addition, the primary conductivity type is one of the positive and negative conductivity types, and the secondary conductivity type is the other of the positive and negative conductivity types. For example, the primary conductivity type transistor is a P type MOS transistor and the secondary conductivity type transistor is an N type MOS transistor.

In addition, the delay buffers DEA and DEB are circuits (for example, logic elements, logic circuits) that output the input logic level as forward or reverse. For example, the delay buffers DEA and DEB are inverters (logic inversion elements).

According to the present embodiment, a transistor is inserted in both the power supply VDD side and the power supply VSS side of the delay buffers DEA and DEB. The input signals PIN and NIN of the comparator 50 are input to the gates of the transistors, and the current (the on-resistance of the transistor) flowing through the transistor is controlled based on the input signals PIN and NIN. This allows the delay buffers DEA and DEB to delay both the rising and falling edges.

Figure 4:
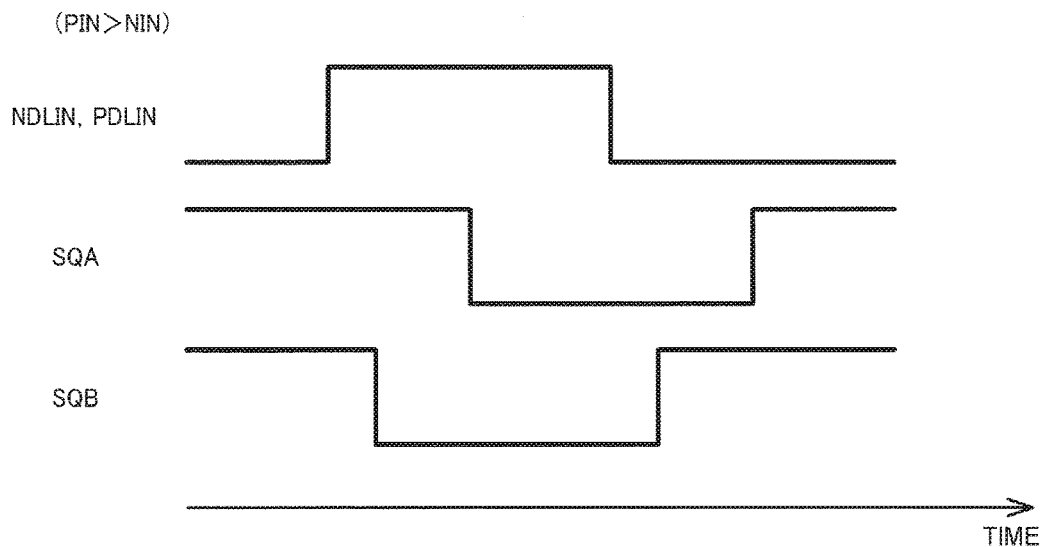
FIG. 4 is a timing chart illustrating delay by the first delay unit and the second delay unit.

FIG. 4 is a timing chart illustrating delay by the delay units UA1 and UB1. The signals SQA and SQB are the output signals of the delay buffers DEA and DEB. The input signal of the delay unit is not limited to FIG. 4. For example, the rising edge may be input after the falling edge, or a signal like a clock signal in which rectangular waves repeat may be input.

As shown in FIG. 4, in a case of PIN>NIN, the current flowing through the transistors TPA and TNA in the delay unit UA1 in FIG. 2 is smaller than the current flowing through the transistors TPB and TNB in the delay unit UB1 in FIG. 3. Therefore, the delay time in the delay buffer DEA is larger at both edges than the delay time in the delay buffer DEB. On the other hand, although not shown in the drawing, in a case of PIN<NIN, the delay time in the delay buffer DEB is larger at both edges than the delay time at the delay buffer DEA. Here, the delay time is the time from the edges of the input signals NDLIN and PDLIN to the edges of the output signals SQA and SQB.

Figure 5:
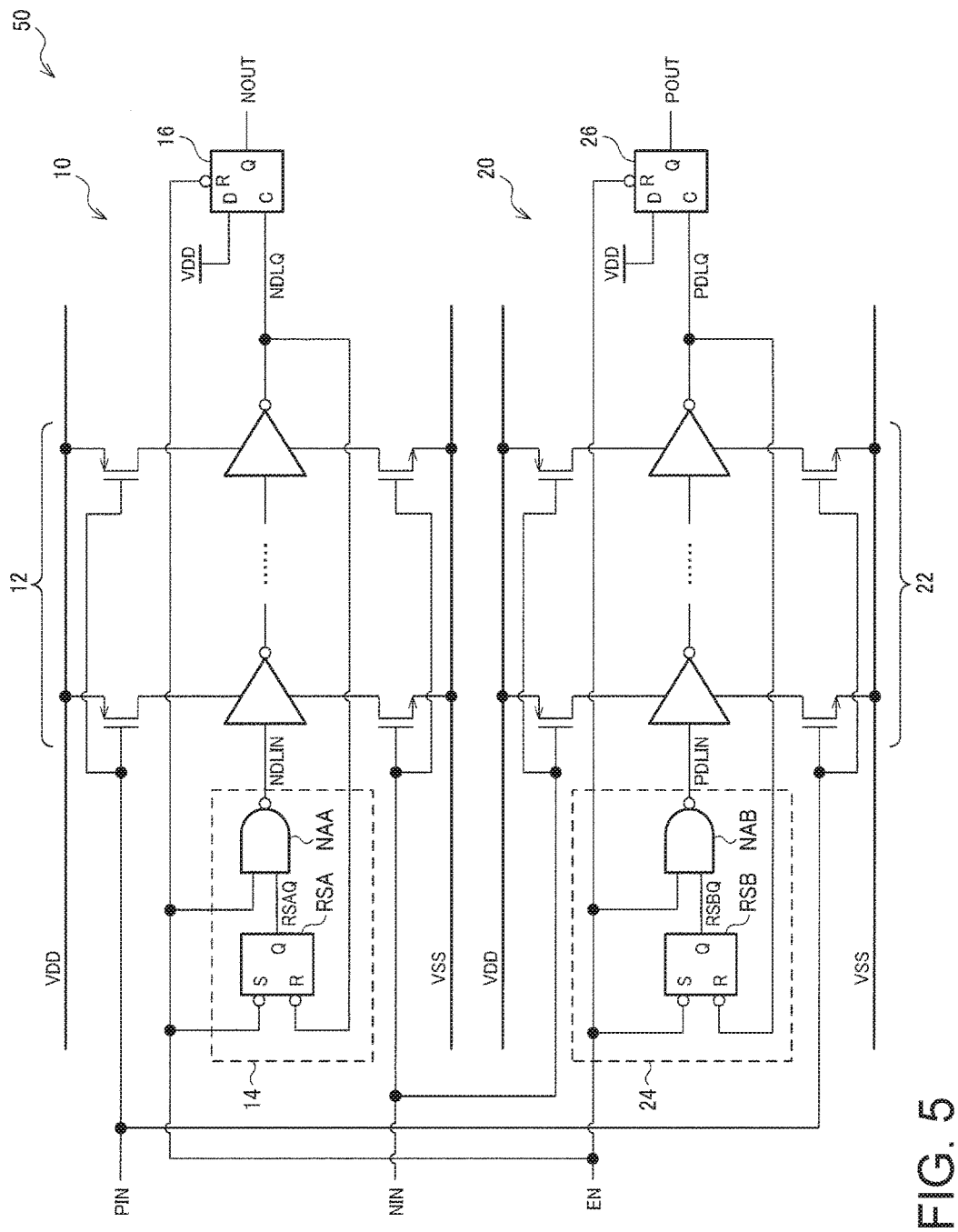
FIG. 5 shows a first detailed configuration example of the comparator of the embodiment.
Figure 6:
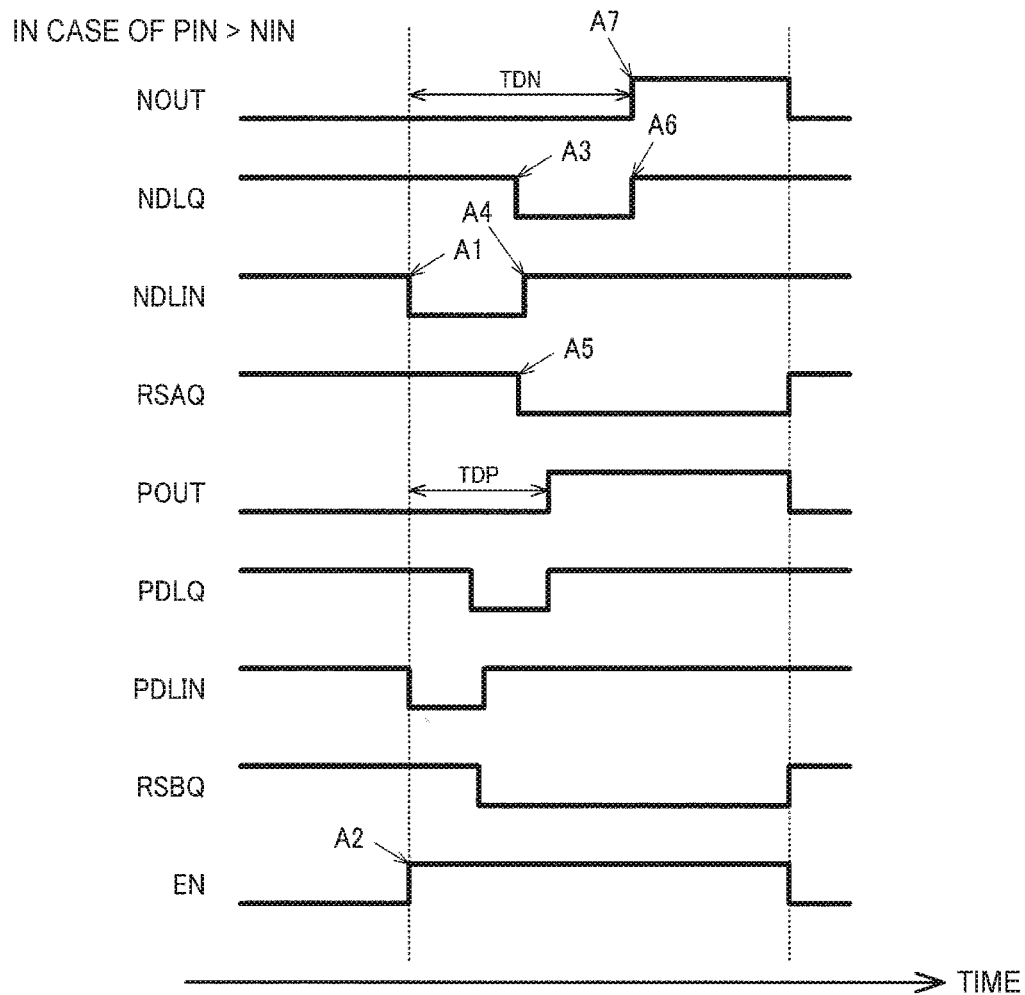
FIG. 6 is a timing chart illustrating an operation of the comparator of the first detailed configuration example, in a case of PIN>NIN.
Figure 7:
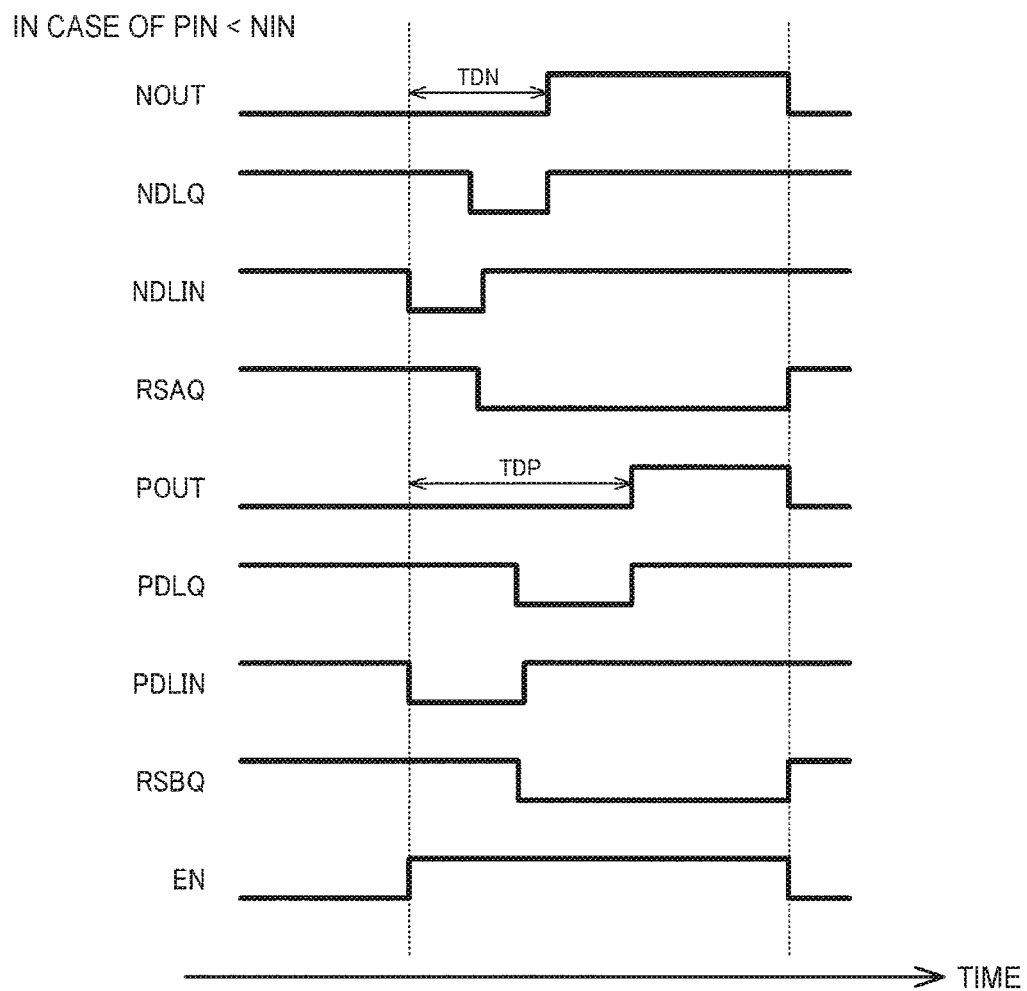
FIG. 7 is a timing chart illustrating an operation of the comparator of the first detailed configuration example, in a case of PIN<NIN.
Figure 12:
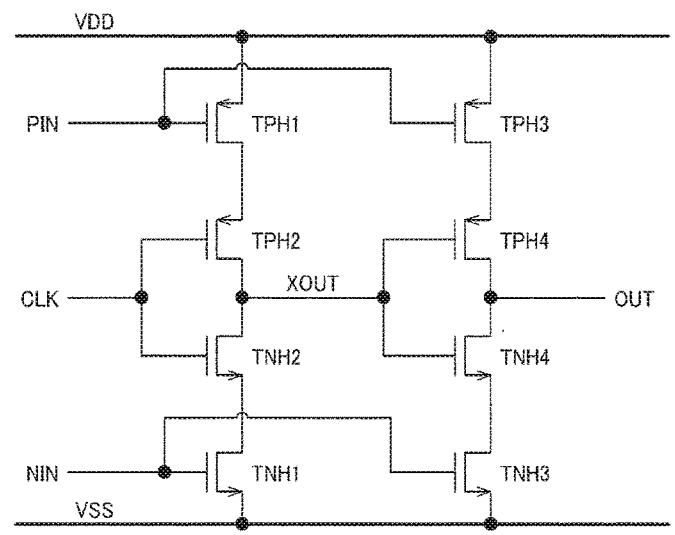
FIG. 12 shows a detailed configuration example of a delay unit of two stages connected in series.
Figure 13:
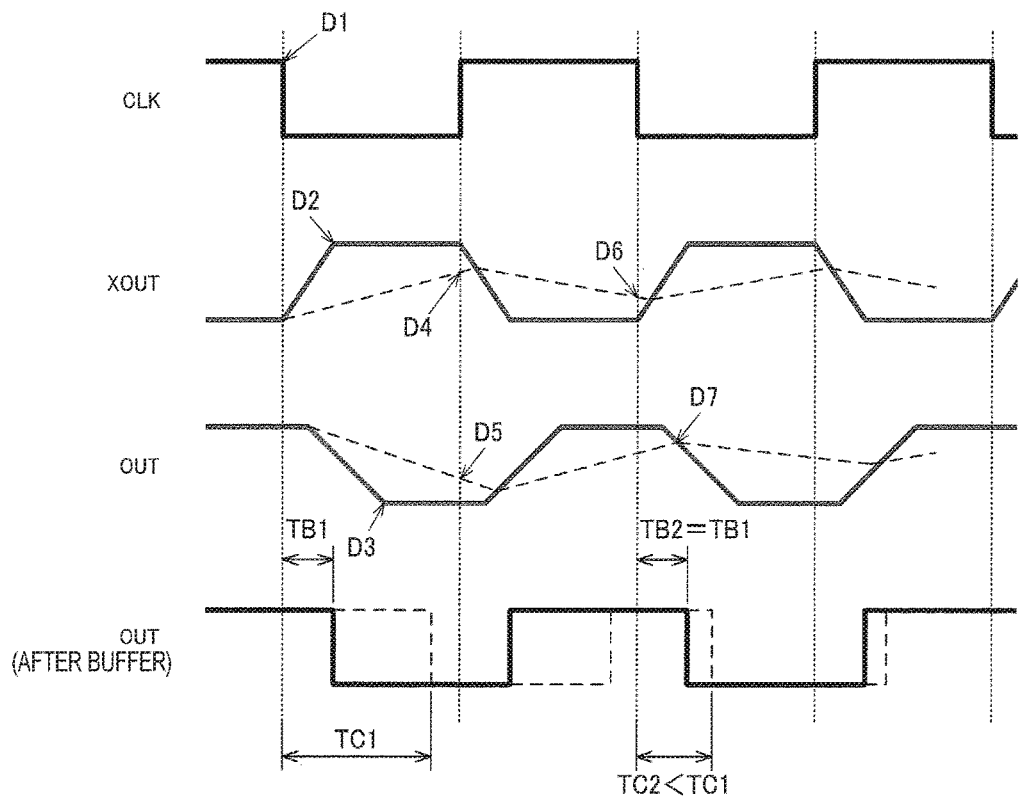
FIG. 13 is a timing chart schematically illustrating the operation of the delay unit.

As described above, in the present embodiment, since the delay units UA1 and UB1 can delay both edges, it is possible to reduce the number of stages of the delay unit and to reduce the layout area of the comparator 50. For example, as illustrated in FIG. 5 to FIG. 7 below, since the input signal generation circuits 14 and 24 are provided and an edge makes two rounds of the delay circuits 12 and 22, the delay time can approximately be doubled. At this time, the falling edge and the rising edge in this order are propagated through the delay circuits 12 and 22 and delayed, but this is realized by delaying both edges. As illustrated in FIG. 12 and FIG. 13 below, the delay circuits 12 and 22 may be incorporated into the ring oscillator. In this case, the oscillation signal (clock signal) of the ring oscillator propagates through the delay circuits 12 and 22, and the oscillation frequency differs according to the delay. This is also realized by delaying both edges. In this way, since both edges can be delayed, it is possible to generate delays a plurality of times by the delay circuits 12 and 22, thereby increasing the delay time while reducing the number of stages.

In the present embodiment, in the first delay buffer DEA, a delay time is controlled based on a current flowing through any one of the first primary conductivity type transistor TPA and the first secondary conductivity type transistor TNA. In the second delay buffer DEB, a delay time is controlled based on a current flowing through any one of the second primary conductivity type transistor TPB and the second secondary conductivity type transistor TNB.

That is, in a case where the inputs of the delay buffers DEA and DEB rise from the low level to the high level, the output falls from the high level to the low level due to the current flowing through the secondary conductivity type transistors TNA and TNB. In this case, the delay time of the falling edge of the output is determined by the current flowing through the secondary conductivity type transistors TNA and TNB according to the signals NIN and PIN. On the other hand, in a case where the inputs of the delay buffers DEA and DEB fall from the high level to the low level, the output rises from the low level to the high level due to the current flowing through the primary conductivity type transistors TPA and TPB. In this case, the delay time of the rising edge of the output is determined by the current flowing through the primary conductivity type transistors TPA and TPB according to the signals PIN and NIN. In addition, the delay time may be controlled by directly supplying the current flowing through the transistor to the delay buffer, or the delay time may be controlled by supplying the current flowing through the transistor to the delay buffer through some circuits or elements.

In this way, at each edge, the delay time is controlled based on the current flowing through any one of the primary conductivity type and secondary conductivity type transistors. By providing both the primary conductivity type and secondary conductivity type transistors in the delay buffer, it is possible to control the delay time at both edges.

2. First Detailed Configuration

FIG. 5 shows a first detailed configuration example of the comparator 50 in the embodiment. In FIG. 5, the first voltage-time conversion circuit 10 includes a first delay circuit 12, a first input signal generation circuit 14, and a first latch circuit 16, and the second voltage-time conversion circuit 20 includes a second delay circuit 22, a second input signal generation circuit 24, and a second latch circuit 26.

A delay circuit of each of the first delay circuit 12 and the second delay circuit 22 includes a plurality of delay units connected in series. Each delay unit is the delay unit shown in FIGS. 2 and 3. Alternatively, it may be the delay unit illustrated later in FIG. 8 and FIG. 14. Here, being connected in series means that the output signal of the delay unit becomes the input signal of the next delay unit.

In this way, each delay circuit includes a plurality of delay units, such that the gain for converting the voltage to time can be increased. In the embodiment, since the edges are delayed twice by the delay circuits 12 and 22, it is possible to realize the same gain as in the case of delaying the edge only once, with about half the number of delay units.

The first input signal generation circuit 14 generates an input signal NDLIN of the first delay circuit 12, and outputs the input signal NDLIN to the first delay circuit 12. The first latch circuit 16 is a latch circuit operating based on the output signal NDLQ of the first delay circuit 12. The second input signal generation circuit 24 generates an input signal PDLIN of the second delay circuit 22, and outputs the input signal PDLIN to the second delay circuit 22. The second latch circuit 26 is a latch circuit operating based on the output signal PDLQ of the second delay circuit 22.

Specifically, the first input signal generation circuit 14 includes an RS latch RSA in which an enable signal EN is input to a set terminal and an output signal NDLQ of the delay circuit 12 is input to a reset terminal, and a NAND circuit (negative AND circuit) NAA in which the enable signal EN and the output signal RSAQ of the RS latch RSA are input. The output signal of the NAND circuit NAA is the input signal NDLIN of the delay circuit 12. The second input signal generation circuit 24 includes an RS latch RSB in which the enable signal EN is input to a set terminal and an output signal PDLQ of the delay circuit 22 is input to a reset terminal, and a NAND circuit NAB in which the enable signal EN and the output signal RSBQ of the RS latch RSB are input. The output signal of the NAND circuit NAB is the input signal PDLIN of the delay circuit 22. The enable signal EN is input from, for example, the control circuit and the processing circuit included in the circuit device including the comparator. Alternatively, the enable signal EN may be input from a CPU or the like provided outside the circuit device including the comparator.

The latch circuits 16 and 26 are, for example, flip-flop circuits. The enable signal EN is input to the reset terminal (low active) of the latch circuit 16, the first logic level (for example, the high level) is input to the data terminal, and the output signal NDLQ of the delay circuit 12 is input to the clock terminal. The output signal of the latch circuit 16 is the output signal NOUT of the voltage-time conversion circuit 10. The enable signal EN is input to the reset terminal (low active) of the latch circuit 26, the first logic level (for example, the high level) is input to the data terminal, and the output signal PDLQ of the delay circuit 22 is input to the clock terminal. The output signal of the latch circuit 26 is the output signal POUT of the voltage-time conversion circuit 20. Note that the latch circuits 16 and 26 are not limited to the flip-flop circuits, and any circuit may be used as long as the circuit fetches the input signal and outputs the fetched signal.

With such a configuration, the first edges propagating through the delay circuits 12 and 22 are fed back to the inputs of the delay circuits 12 and 22 as the second edges by the input signal generation circuits 14 and 24. Then, the edges obtained by two rounds by the delay circuits 12 and 22 are latched by the latch circuits 16 and 26. In this way, since the edge makes two rounds of the delay circuits 12 and 22, the number of stages of the delay units can be halved while maintaining the delay time.

FIG. 6 is a timing chart illustrating the operation of the comparator 50 of FIG. 5, in a case of PIN>NIN.

As indicated by A1 of FIG. 6, the first input signal generation circuit 14 changes the input signal NDLIN of the first delay circuit 12 from a high level (a first logic level) to a low level (a second logic level). That is, as indicated by A2, the enable signal EN changes from the low level to the high level, whereby the output signal (input signal NDLIN) of the NAND circuit NAA changes from the high level to the low level.

As indicated by A3, the falling edge of the input signal NDLIN propagates through the delay circuit 12, and the output signal NDLQ of the delay circuit 12 changes from the high level to the low level. In this case, as indicated by A4, the input signal generation circuit 14 changes the input signal NDLIN of the delay circuit 12 from the low level to the high level. That is, as indicated by A5, the RS latch RSA is reset by the output signal NDLQ becoming the low level, and the output signal RSAQ of the RS latch RSA changes from the high level to the low level. As the output signal RSAQ of the RS latch RSA goes to the low level, the output signal (the input signal NDLIN) of the NAND circuit NAA changes from the low level to the high level.

As indicated by A6, the rising edge of the input signal NDLIN propagates through the delay circuit 12, and the output signal NDLQ of the delay circuit 12 changes from the low level to the high level. In this case, the first latch circuit 16 changes the output signal NOUT from a low level to a high level. That is, when the enable signal EN is the high level, the latch circuit 16 is released from reset. When the input signal (the output signal NDLQ) of the clock terminal rises, the input signal (high level) of the data terminal is fetched and the output signal NOUT changes from the low level to the high level.

In this way, the edge makes two rounds of the delay circuit 12 after the enable signal EN goes to the high level, and the output signal NOUT goes to the high level after the delay time TDN.

The operation of the second voltage-time conversion circuit 20 is the same. That is, the second input signal generation circuit 24 changes the input signal PDLIN of the second delay circuit 22 from a high level to a low level. In a case where the output signal PDLQ of the delay circuit 22 changes from the high level to the low level, the input signal generation circuit 24 changes the input signal PDLIN of the delay circuit 22 from the low level to the high level. In a case where the output signal PDLQ of the delay circuit 22 is changed from the low level to the high level, the second latch circuit 26 changes the output signal POUT from the low level to the high level. In this way, the edge makes two rounds of the delay circuit 22 after the enable signal EN goes to the high level, and the output signal POUT goes to the high level after the delay time TDP.

In the case of PIN>NIN, it is established that TDP<TDN, the output signal POUT rises earlier than the output signal NOUT. In a case where it is detected that the output signal POUT rises earlier, the determination circuit 30 determines that PIN>NIN, and outputs the determination result (for example, a determination signal CPQ of a high level).

FIG. 7 is a timing chart illustrating the operation of the comparator 50 of FIG. 5, in a case of PIN<NIN. Since the operation is the same as in FIG. 6, the description thereof will be omitted.

In the case of PIN<NIN, it is established that TDP>TDN, the output signal NOUT rises earlier than the output signal POUT. In a case where it is detected that the output signal NOUT rises earlier, the determination circuit 30 determines that PIN<NIN, and outputs the determination result (for example, a determination signal CPQ of a low level).

3. Second Detailed Configuration

Figure 8:
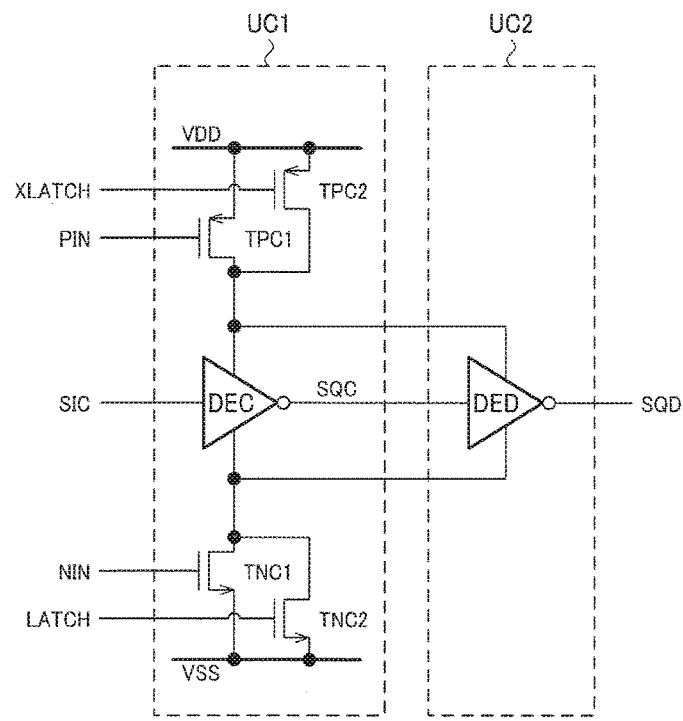
FIG. 8 shows a second configuration example of the delay unit.

FIG. 8 shows a second configuration example of the delay unit. This delay unit can be applied to the first delay circuit 12 in FIG. 1, FIG. 5, and FIG. 12. The delay unit UC1 includes a P-type transistor TPC1, an N-type transistor TNC1, and a delay buffer DEC. The delay unit UC2 includes a delay buffer DED.

The source of the transistor TPC1 is connected to the power supply VDD, and the drain is commonly connected to the high potential side power supply nodes of the delay buffer DEC and the delay buffer DED. The input signal PIN is input to the gate of the transistor TPC1. The source of the transistor TNC1 is connected to the power supply VSS and the drain is commonly connected to the low potential side power supply nodes of the delay buffer DEC and the delay buffer DED. The input signal NIN is input to the gate of the transistor TNC1.

That is, in the first delay circuit 12, the first primary conductivity type transistor (TPC1) and the first secondary conductivity type transistor (TNC1) are shared between at least two delay units (UC1 and UC2) of a plurality of delay units. The first delay circuit 12 may include only one set of delay units UC1 and UC2, or may include a plurality of sets of delay units UC1 and UC2 connected in series.

Similarly, in the second delay circuit 22, the second primary conductivity type transistor and the second secondary conductivity type transistor are shared between at least two delay units of a plurality of delay units. Specifically, the delay unit of the second delay circuit 22 has the same configuration as that of FIG. 8. However, it is different from FIG. 8 in that the input signal NIN is input to the gate of the P-type transistor and the input signal PIN is input to the gate of the N-type transistor.

With such a configuration, one delay unit of the delay units UC1 and UC2 of two stages uses one of the transistors TPC1 and TNC1, and the other delay unit uses the other of the transistors TPC1 and TNC1. Therefore, the delay control transistors TPC1 and TNC1 are effectively used, and the layout area can be reduced while allowing delay at both edges.

For example, when the input signal SIC of the delay unit UC1 of the first stage rises, the output signal SQC thereof falls, such that the N-type transistor TNC1 is used. Then, when the input signal (SQC) of the delay unit UC2 of the second stage falls, the output signal SQD thereof rises, such that the P-type transistor TPC1 is used. In this way, even in a case where one edge is input, both transistors TPC1 and TNC1 are necessarily used, and there is no useless transistor. Therefore, the layout area can be reduced as compared with the case where delay units of two stages are connected in series as shown in FIG. 2 and FIG. 3.

In FIG. 8, the delay unit UC1 includes a P-type transistor TPC2 (a primary conductivity type transistor) and an N-type transistor TNC2 (a secondary conductivity type transistor). A similar transistor can also be provided in the delay unit of the second delay circuit 22.

The source of the transistor TPC2 is connected to the power supply VDD, and the drain is commonly connected to the high potential side power supply nodes of the delay buffer DEC and the delay buffer DED. A signal XLATCH is input to the gate of the transistor TPC2. The source of the transistor TNC2 is connected to the power supply VSS and the drain is commonly connected to the low potential side power supply nodes of the delay buffer DEC and the delay buffer DED. A signal LATCH is input to the gate of the transistor TNC2. The signal XLATCH is a signal in which the logic level of the signal LATCH is inverted.

In a case where a determination result of the determination circuit 30 is confirmed, the power supply voltages to be supplied to the delay buffers DEC and DED are set to a predetermined voltage. That is, in a case where the determination result of the determination circuit 30 is confirmed, the signal LATCH goes to the high level, the signal XLATCH goes to the low level, and the transistors TNC2 and TPC2 are turned on. Thus, the high potential side power supply nodes of the delay buffers DEC and DED are connected to the power supply VDD (set to the voltage of VDD) and the low potential side power supply nodes of the delay buffers DEC and DED are connected to the power supply VSS (set to the voltage of VSS).

By providing the delay setting transistors TPC1 and TNC1, the edges of the output signals SQC and SQD of the delay buffers DEC and DED gradually change (become rounded). Then, in the next comparison by the comparator 50, the output signals SQC and SQD start from the voltages between the power supplies VDD and VSS without starting from the power supplies VDD and VSS, and there is a possibility that a sufficient delay does not occur (immediately reaches the logical threshold voltage of the delay buffer of the next stage). In this regard, according to the embodiment, in a case where a determination result of the determination circuit 30 is confirmed, the power supply voltages to be supplied to the delay buffers DEC and DED are set to a predetermined voltage, such that a next comparison by the comparator 50 can be started from the state where the output signals SQC and SQD reach the power supplies VDD and VSS. Details of this fact will be described later with reference to FIGS. 12 to 14 or the like.

Although the case where the transistors TPC2 and TNC2 are shared between delay units of two stages is described in FIG. 8, the invention is not limited thereto. That is, transistors corresponding to the transistors TPC2 and TNC2 may be provided in the delay units in FIG. 2 and FIG. 3 (that is, in each delay unit).

4. Determination Circuit

Figure 9:
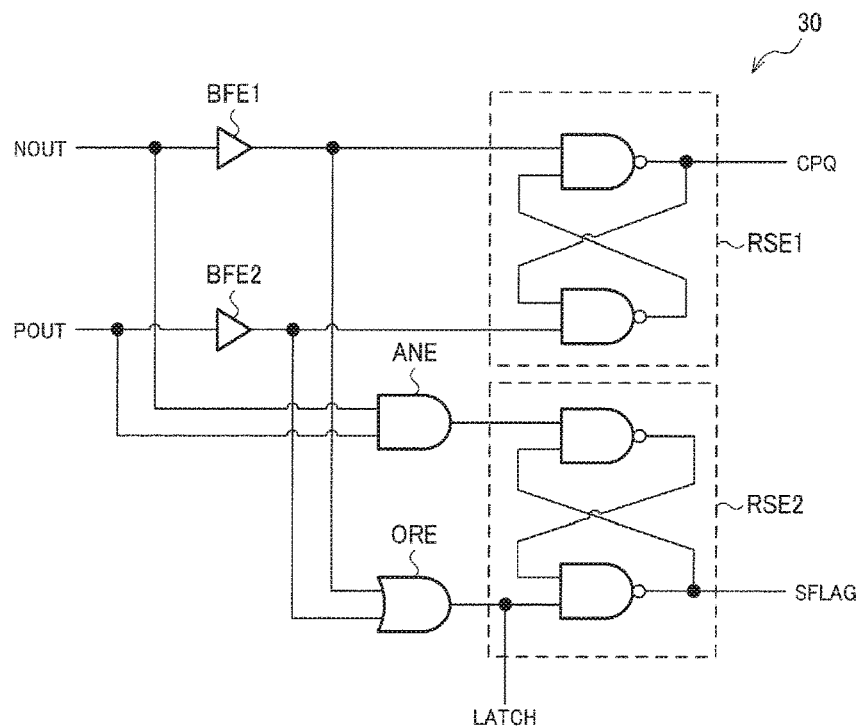
FIG. 9 shows a detailed configuration example of a determination circuit.

FIG. 9 shows a detailed configuration example of the determination circuit 30. The configuration of the determination circuit 30 is not limited to FIG. 9, but any circuit may be used as long as the circuit is able to determine whether the edge is output earlier than one of the signals NOUT and POUT.

The determination circuit 30 of FIG. 9 includes buffers BFE1 and BFE2 that delay the signals NOUT and POUT, an RS latch RSE1 to which the output signals of the buffers BFE1 and BFE2 are input, an AND circuit ANE (logical product circuit) that outputs a logical product of the signals NOUT and POUT, an OR circuit ORE (logical sum circuit) that outputs a logical sum of the output signals of the buffers BFE1 and BFE2, and an RS latch RSE2 to which the output signals of the AND circuit ANE and the OR circuit ORE are input.

The output signal of the RS latch RSE1 is the determination signal CPQ. In the case of PIN>NIN, the determination signal CPQ goes to a high level, and in the case of PIN<NIN, the determination signal CPQ goes to a low level.

The output signal of the OR circuit ORE is the signal LATCH described in FIG. 8. The signal LATCH goes to a high level (active) in a case where any of the signals NOUT and POUT goes to the high level (that is, in a case where the determination is confirmed).

The output signal of the RS latch RSE2 is a minute determination flag signal SFLAG indicating whether or not the voltage difference (time difference between the signals POUT and NOUT) between the signals PIN and NIN is minute. In a case where the voltage difference is minute, the signal SFLAG goes to the high level (active), and in a case where the voltage difference is not minute, the signal SFLAG goes to the low level. In a case where the voltage difference between the signals PIN and NIN is small, the comparator 50 has a dead zone of magnitude comparison (a range where a determination result is stochastically determined, as will be described later). For example, the voltage difference determined to be minute is set to the extent of the dead zone. In a case where the signal SFLAG is at a high level, magnitude comparison is made a plurality of times for the same signals PIN and NIN. This makes it possible to substantially reduce the dead zone.

Figure 10:
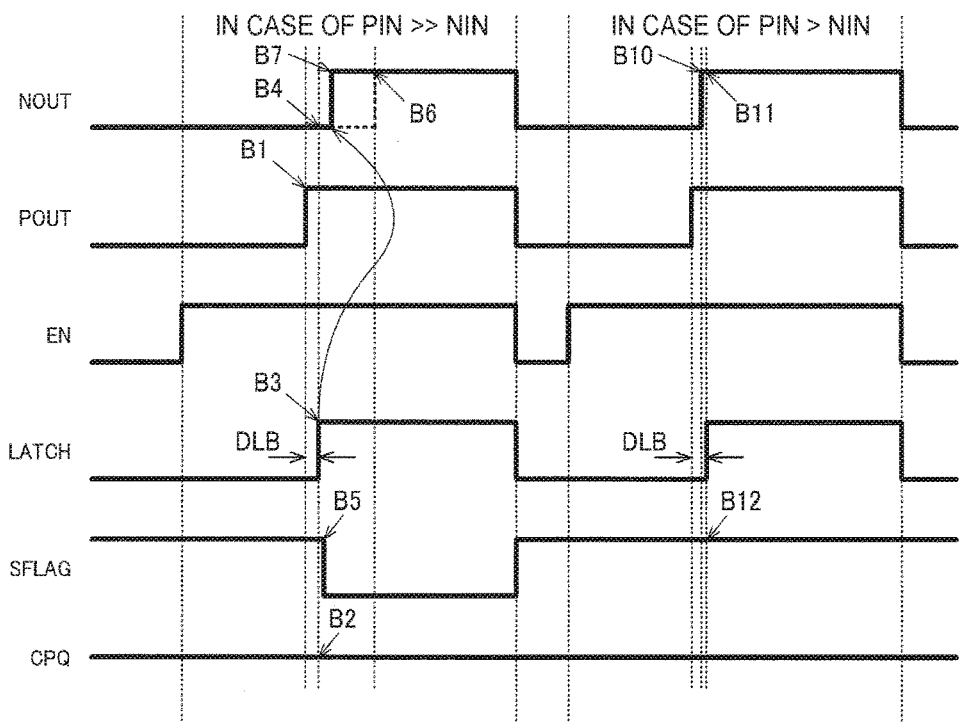
FIG. 10 is a timing chart illustrating an operation of the determination circuit, in a case of PIN>NIN.

FIG. 10 is a timing chart illustrating the operation of the determination circuit 30, in a case of PIN>NIN. PIN>>NIN indicates that the signal PIN is a voltage sufficiently larger than the signal NIN (not a minute signal).

First, the size determination of the signals PIN and NIN will be described. As indicated by B1 in FIG. 10, the signal POUT goes to a high level from a low level earlier than the signal NOUT. Then, as indicated by B2, the RS latch RSE1 latches the high level after the delay time by the buffer BFE2, and the determination signal CPQ is determined to be the high level. This determination operation is the same regardless of whether or not it is a minute signal.

Next, the signal LATCH, the minute determination flag signal SFLAG will be described. First, a case where it is not a minute signal will be described. As indicated by B3, the signal LATCH goes to the high level from the low level after the delay time DLB by the buffer BFE2 since the signal POUT goes to the high level. In the case of PIN>>NIN, when the signal LATCH goes to the high level, the signal NOUT is at the low level as indicated by B4 (since the time difference is large, it does not go to the high level). Therefore, the output signal of the AND circuit ANE is at a low level, the RS latch RSE2 latches the low level as indicated by B5, and the signal SFLAG is determined to be the low level.

In addition, the signal NOUT originally changes from the low level to the high level at the timing indicated by B6. However, when the signal LATCH goes to the high level, the transistors (TPC1 and TNC1 in FIG. 8) that set the delay are shortcut by the transistors (TPC2 and TNC2) that are turned on by the signals LATCH and XLATCH. Therefore, as indicated by B7, the delay time of the signal NOUT becomes short.

Next, a case of a minute signal will be described. As indicated by B10, the time difference between the falling edges of the signals POUT and NOUT is smaller than the delay time DLB by the buffer BFE2. In this case, when the signal LATCH goes to the high level, the signal NOUT is at the high level as indicated by B11. Therefore, the output signal of the AND circuit ANE is at a high level, the RS latch RSE2 latches the high level as indicated by B12, and the signal SFLAG is determined to be the high level.

Figure 11:
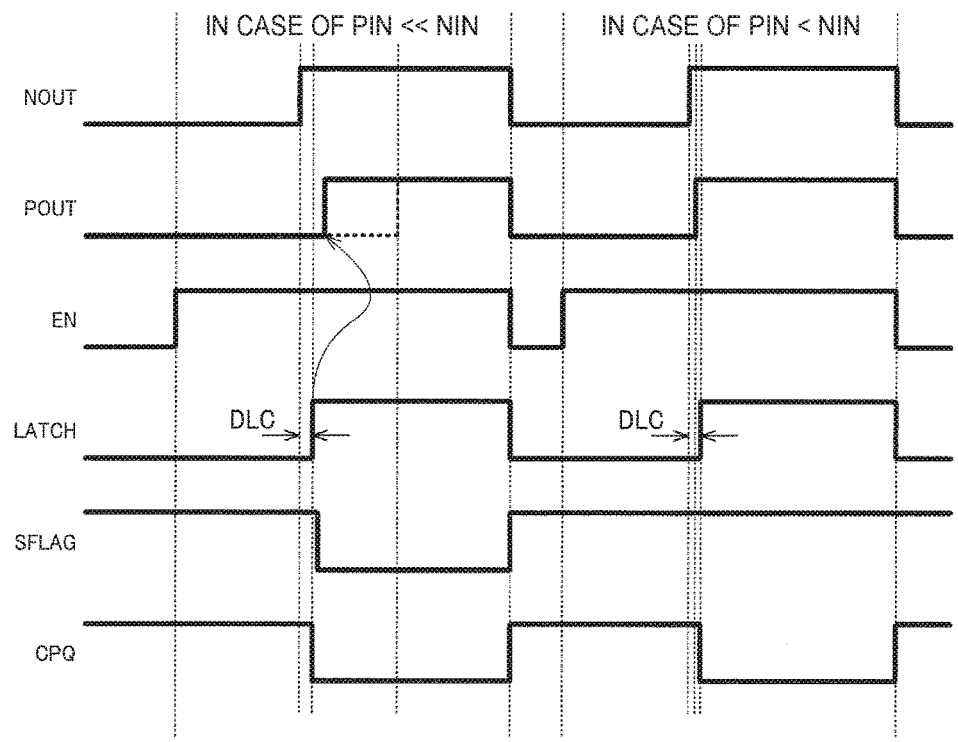
FIG. 11 is a timing chart illustrating the operation of the determination circuit, in a case of PIN<NIN.

FIG. 11 is a timing chart illustrating the operation of the determination circuit 30, in a case of PIN<NIN. PIN<<NIN indicates that the signal NIN is a voltage sufficiently larger than the signal PIN (not a minute signal).

Since the operation is the same as in the case of PIN>NIN, the outline will be described. In the case of PIN<NIN, since the signal NOUT goes to a high level from a low level earlier than the signal POUT, the RS latch RSE1 latches the low level after the delay time by the buffer BFE1 and the determination signal CPQ is determined to be the low level.

In a case where it is not a minute signal, the signal LATCH goes to the high level from the low level after the delay time DLC by the buffer BFE1 since the signal NOUT goes to the high level, the RS latch RSE2 latches the low level, and the signal SFLAG is determined to be the low level. When the signal LATCH goes to the high level, the transistor that sets the delay is shortcut by the transistor that is turned on by the signals LATCH and XLATCH, such that the delay time of the signal POUT becomes short.

In a case of a minute signal, the time difference between the falling edges of the signals POUT and NOUT is smaller than the delay time DLC by the buffer BFE1. In this case, when the signal LATCH goes to the high level, the RS latch RSE2 latches the high level and the signal SFLAG is determined to be the high level.

5. Detailed Operation of Delay Unit

The detailed operation of the delay unit and the power supply voltage reset operation of the delay buffer by the signal LATCH will be described below.

FIG. 12 shows a detailed configuration example of delay units of two stages connected in series. The transistors TPH1, TNH1, TPH3, and TNH3 are transistors that set the delay. The transistors TPH2, TNH2, TPH4, and TNH4 are transistors constituting a delay buffer (an inverter).

FIG. 13 is a timing chart schematically illustrating the operation of the delay unit in FIG. 12. The solid line is a timing chart in a case where the delay is small (PIN<NIN), and the dotted line is a timing chart in a case where the delay is large (PIN>NIN). The input signal CLK schematically shows the signal propagating through the delay circuit 12 in the comparator 50 of FIG. 5. One cycle of the signal CLK corresponds to one determination by the comparator 50. The signal OUT (after buffer) is the output signal of the buffer in a case where it is assumed that a buffer is provided at the delay unit of the next stage in FIG. 12.

First, a case is considered where the delay is small and the on-resistances of the transistors TPH1, TNH1, TPH3, and TNH3 are sufficiently small. As indicated by D1 in FIG. 13, when the signal CLK falls, as indicated by D2, the output signal XOUT of the delay unit of the first stage reaches the high level until the next falling edge of the signal CLK. Similarly, as indicated by D3, the output signal OUT of the delay unit of the second stage reaches the low level. As described above, since the signals XOUT and OUT necessarily start changing from the power supply level at each edge, the same conditions are satisfied at every edge and the same delay times TB1 and TB2 occur.

Next, a case is considered where the delay is large and the on-resistances of the transistors TPH1, TNH1, TPH3, and TNH3 are sufficiently large. In this case, there is a possibility that the output signal XOUT of the delay unit of the first stage does not reach the high level between the falling edge and the next falling edge of the signal CLK, as indicated by D4. Similarly, there is a possibility that the output signal OUT of the delay unit of the second stage does not reach the low level, as indicated by D5. Then, as indicated by D6 and D7, when the falling edge of the next signal CLK arrives, the signals XOUT and OUT start to change from the voltage between the high level and the low level. Since the signals XOUT and OUT start changing from the power supply level at the falling edge of the first signal CLK, the condition changes. In this way, when the voltage levels at which the signals XOUT and OUT start to change at each edge are different, a time until reaching the logical threshold voltage of the next stage varies, and there is a possibility that the delay times TC1 and TC2 at the respective edges are different.

In the second determination, since the delay time TC2 is shorter than the delay time TC1 of the first determination, it corresponds to a decrease in the gain of the voltage-time conversion. Then, there is a possibility that the gain is different for each determination. In addition, there is a possibility that the time difference between the output signals NOUT and POUT of the voltage-time conversion circuits 10 and 20 is not sufficiently obtained and the dead zone substantially widens.

Figure 14:
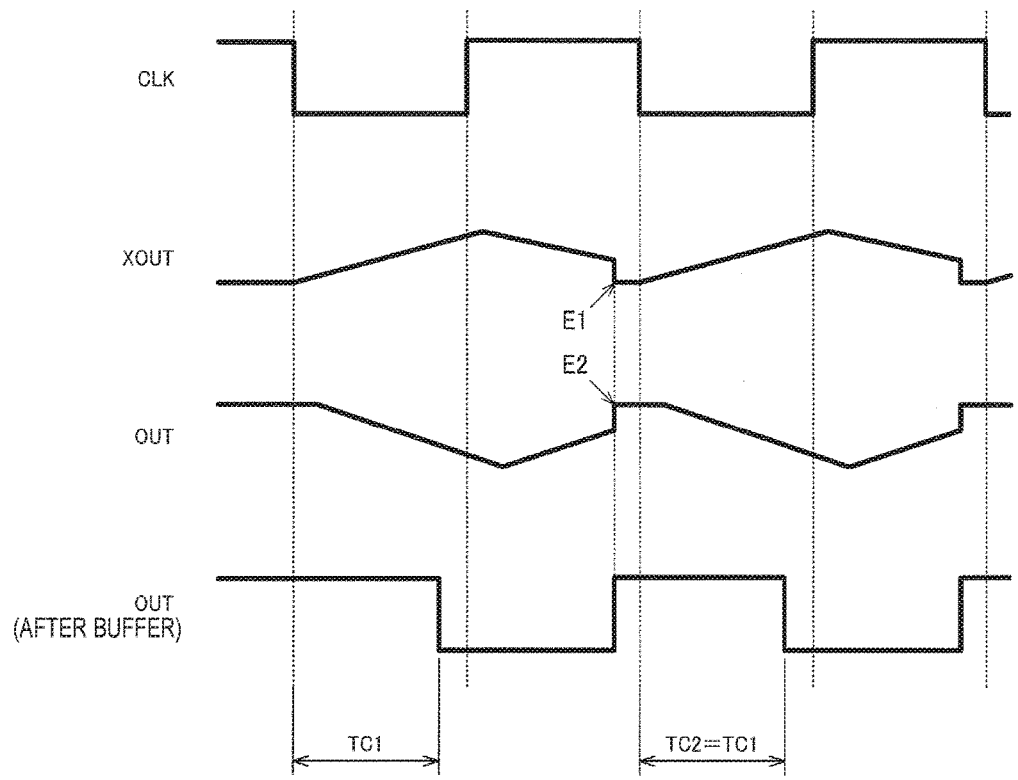
FIG. 14 is a timing chart schematically illustrating the operation of a power supply voltage reset of a delay buffer.

FIG. 14 is a timing chart schematically illustrating the operation of a power supply voltage reset of a delay buffer by a signal LATCH.

Here, transistors corresponding to the transistors TPC2 and TNC2 of FIG. 8 are provided in parallel to the transistors TPH1 and TNH1 of FIG. 12, and similarly, transistors corresponding to the transistors TPC2 and TNC2 of FIG. 8 are provided in parallel to the transistors TPH3 and TNH3 of FIG. 12.

As indicated by E1 and E2 in FIG. 14, when the determination result is confirmed and the signal LATCH goes to the high level, the transistors provided in parallel to the transistors TPH2, TNH2, TPH4, and TNH4 are turned on, and the sources of the transistors TPH2, TNH2, TPH4, and TNH4 are connected to the power supply. Thus, the signals XOUT and OUT are reset to the power supply level. Therefore, since the signals XOUT and OUT necessarily start changing from the power supply level at each edge, the delay times TC1 and TC2 are the same.

In FIG. 14, the signal LATCH is at the high level at the timing when OUT (after buffer) rises, but actually, when one of the signals POUT and NOUT rises earlier and the determination is confirmed, the signal LATCH goes to the high level.

6. Second Detailed Configuration

Figure 15:
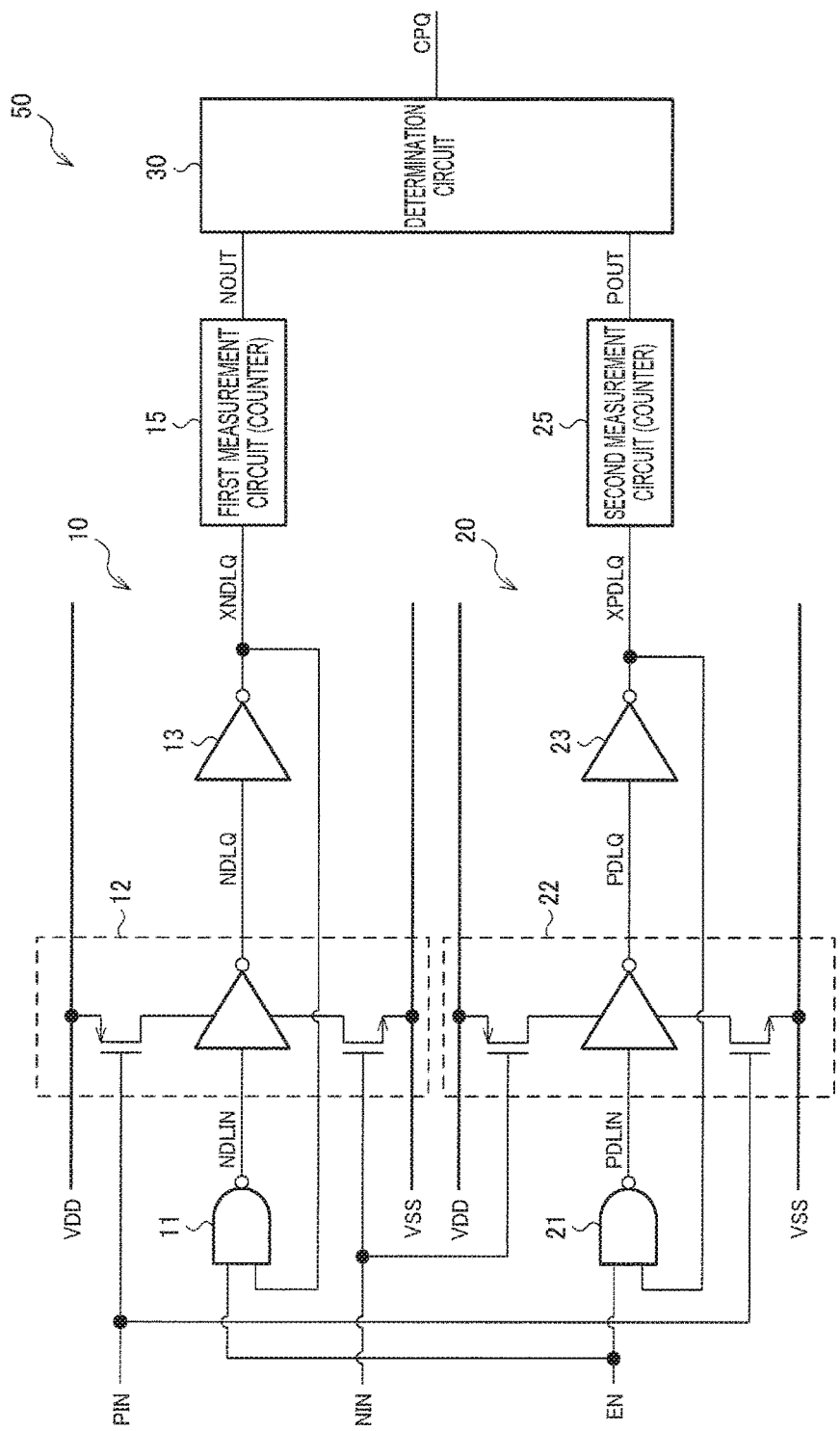
FIG. 15 shows a second detailed configuration example of the comparator of the embodiment.

FIG. 15 shows a second detailed configuration example of the comparator 50 in the embodiment. In FIG. 15, the first voltage-time conversion circuit 10 includes a first delay circuit 12, a third input signal generation circuit 11, an inverter 13 (a buffer in a broad sense), and a first measurement circuit 15, and the second voltage-time conversion circuit 20 includes a second delay circuit 22, a fourth input signal generation circuit 21, an inverter 23 (a buffer in a broad sense), and a second measurement circuit 25.

The first measurement circuit 15 measures the number of pulses of the output signal NDLQ from the first delay circuit 12. The output signal NOUT of the first voltage-time conversion circuit 10 is generated based on the measurement result of the first measurement circuit 15. The second measurement circuit 25 measures the number of pulses of the output signal PDLQ from the second delay circuit 22. The output signal POUT of the second voltage-time conversion circuit 20 is generated based on the measurement result of the second measurement circuit 25. The determination circuit 30 determines the magnitude relation of the first input signal PIN and the second input signal NIN, based on the measurement results (signals NOUT and POUT based on the measurement results) from the first measurement circuit 15 and the second measurement circuit 25.

In FIG. 15, the measurement circuits 15 and 25 count the number of pulses of the signals XNDLQ and XPDLQ obtained by buffering the signals NDLQ and PDLQ by the inverters 13 and 23, respectively. This is equivalent to counting of the number of pulses of the signals NDLQ and PDLQ.

For example, the measurement circuits 15 and 25 are counters that count the number of pulses of the signals NDLQ and PDLQ, and set the signals NOUT and POUT to the high level in a case where the count value reaches a predetermined value. The measurement circuits 15 and 25 are not limited to counters, and may be any circuit as long as the circuit can convert the number of pulses of signals NDLQ and PDLQ into signals NOUT and POUT. For example, the measurement circuits may be shift registers in which bits are shifted by pulses of the signals NDLQ and PDLQ.

A delay circuit of each of the first delay circuit 12 and the second delay circuit 22 includes, for example, a delay unit of only one stage. Alternatively, each delay circuit may be a plurality of delay units connected in series.

According to the embodiment, the frequencies (the number of pulses per unit time) of the output signals NDLQ and PDLQ from the delay circuits 12 and 22 change with delay times according to the signals PIN and NIN. This makes it possible to determine the magnitude relation of the signals PIN and NIN based on the number of pulses of the signals NDLQ and PDLQ.

In the embodiment, the first voltage-time conversion circuit 10 includes a first ring oscillator in which the output signal NDLQ of the first delay circuit 12 is fed back to the input signal NDLIN. The second voltage-time conversion circuit 20 includes a second ring oscillator in which the output signal PDLQ of the second delay circuit 22 is fed back to the input signal PDLIN.

The first ring oscillator corresponds to a loop configured with the third input signal generation circuit 11, the first delay circuit 12, and the inverter 13. The second ring oscillator corresponds to a loop configured with the fourth input signal generation circuit 21, the second delay circuit 22, and the inverter 23.

In this way, by configuring the ring oscillator including the delay circuits 12 and 22, the oscillation frequency of the ring oscillator varies according to the signals PIN and NIN. This makes it possible to determine the magnitude relation of the signals PIN and NIN based on the number of pulses of the signals NDLQ and PDLQ.

In the embodiment, the third input signal generation circuit 11 receives the enable signal EN and the signal XNDLQ based on the output signal NDLQ of the first delay circuit 12, and generates the input signal NDLIN of the first delay circuit 12. The fourth input signal generation circuit 21 receives the enable signal EN and the signal XPDLQ based on the output signal PDLQ of the second delay circuit 22, and generates the input signal PDLIN of the second delay circuit 22.

For example, the input signal generation circuits 11 and 21 are NAND circuits (negative logical product circuit). In this case, if the enable signal EN goes to the high level, the NAND circuit functions in the same way as the inverter for the signal XNDLQ. That is, a ring oscillator is configured with inverted logic circuits of stages of an odd number.

With such a configuration, it is possible to configure a first ring oscillator in which the output signal NDLQ of the first delay circuit 12 is fed back to the input signal NDLIN, and a second ring oscillator in which the output signal PDLQ of the second delay circuit 22 is fed back to the input signal PDLIN.

In FIG. 15, the signals based on the output signals NDLQ and PDLQ of the delay circuits 12 and 22 are the output signals XNDLQ and XPDLQ of the inverters 13 and 23, but the invention is not limited thereto, and the signals NDLQ and PDLQ may be the signals NDLQ and PDLQ themselves. For example, the delay circuits 12 and 22 may be configured with delay units of stages of an even number, and the output signals NDLQ and PDLQ may be input to the input signal generation circuits 11 and 21.

Figure 16:
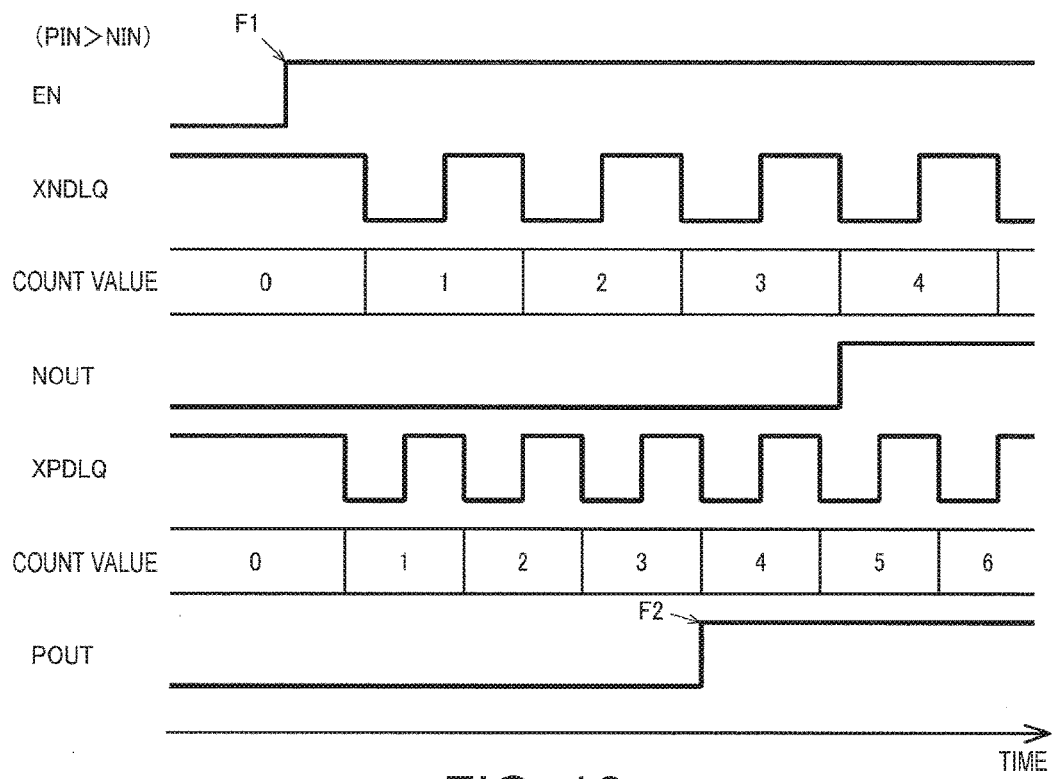
FIG. 16 is a timing chart illustrating an operation of the second detailed configuration example of the comparator.

FIG. 16 is a timing chart illustrating the operation of the second detailed configuration example of the comparator 50. FIG. 16 illustrates the case where the predetermined value of the count value is "4", but the predetermined value is not limited to "4".

As indicated by F1 in FIG. 16, if the enable signal EN goes to the high level from the low level, the ring oscillator starts oscillating. In the case of PIN>NIN, since the delay time of the first delay circuit 12 is larger than that of the second delay circuit 22, and the oscillation frequency of the first ring oscillator is lower than that of the second ring oscillator (the number of pulses of the signal XNDLQ per unit time decreases). Therefore, as indicated by F2, the count value of the second measurement circuit 25 reaches the predetermined value "4" earlier than the count value of the first measurement circuit 15, and the signal POUT goes to the high level from the low level earlier than the signal NOUT.

In a case of PIN<NIN, since the oscillation frequency of the second ring oscillator is lower than that of the first ring oscillator, the count value of the first measurement circuit 15 reaches a predetermined value earlier than the count value of the second measurement circuit 25, and the signal NOUT goes to the high level from the low level earlier than the signal POUT.

7. With Regard to Dead Zone of Comparator

Figure 17:
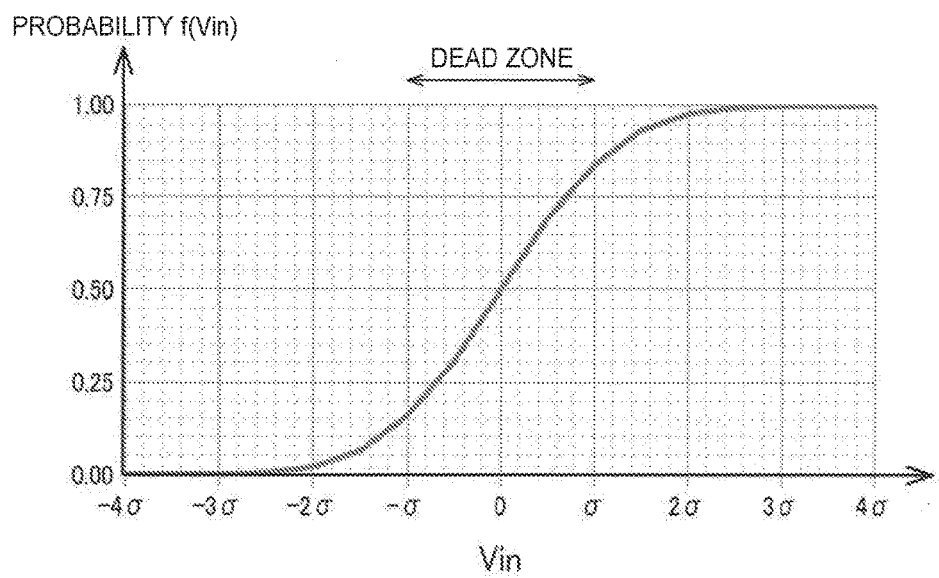
FIG. 17 is a diagram illustrating a dead zone of the comparator.

FIG. 17 is a diagram illustrating a dead zone of the comparator. The voltage input to the positive terminal of comparator is set to VP, and the voltage input to the negative terminal is set to VN. In FIG. 17, the horizontal axis represents the voltage Vin=VP−VN, and the vertical axis represents the probability that the output of the comparator goes to a high level.

Here, the comparator is considered as a model. That is, a model is considered in which a voltage VP+Vn is input to the positive terminal of a comparator without a dead zone and a voltage VN is input to the negative terminal. The absence of a dead zone means that the output is determined to be the high level (100%) in a case of VP>VN, and the output is determined to be the low level (100%) in a case of VP<VN. The voltage Vn is a noise according to a normal distribution in which the average value is zero and the variance is the square of σ. In this case, the probability f(Vin) that the output of the comparator goes to a high level is a cumulative distribution function like the following Expression (1). Here, erf( ) is an error function.

$$f(Vin) = \frac{1}{2}\left(1 + erf\left(\frac{Vin}{\sqrt{2\sigma^2}}\right)\right) \quad (1)$$

Since the right side of Expression (1) is a function of Vin/σ, the same probability f(Vin) is obtained if Vin/σ is the same.

As illustrated in FIG. 17, for example, the voltage range of −σ≤Vin≤+σ (so-called 1 sigma) is defined as a dead zone. In this voltage range, the probability that the output of comparator goes to a high level is in the range of 15.9% or more and 84.1% or less.

In FIG. 13, it is described that when the comparison is repeated, the delay time becomes shorter and the dead zone spreads. This will be described by using the above model. That is, shortening of the delay time means that the gain of the voltage-time conversion decreases, but corresponds to the fact that the difference (Vin) of the input voltage is substantially reduced on the input side of the comparator. Then, σ of the noise voltage Vn appears relatively large. That is, in FIG. 17, +σ on the horizontal axis moves to the positive side, −σ moves to the negative side, and the dead zone is expanded.

In the delay unit as shown in FIG. 8, since the delay time as described above is not be shortened, the dead zone of the comparator is not increased even if the comparison operation by the comparator is repeated many times. If the dead zone increases, the determination accuracy of the minute signal decreases, but, the determination can be made at high determination accuracy, by using the delay unit as shown in FIG. 8.

In addition, in FIG. 9, the minute determination flag signal SFLAG is described. By setting the delay time of the buffers BFE1 and BFE2 such that the signal SFLAG becomes active in a case where the voltage Vin is within the range of the dead zone, it becomes possible to know that the input voltage is within the range of the dead zone, and to take various countermeasures accordingly.

8. Circuit Device

Figure 18:
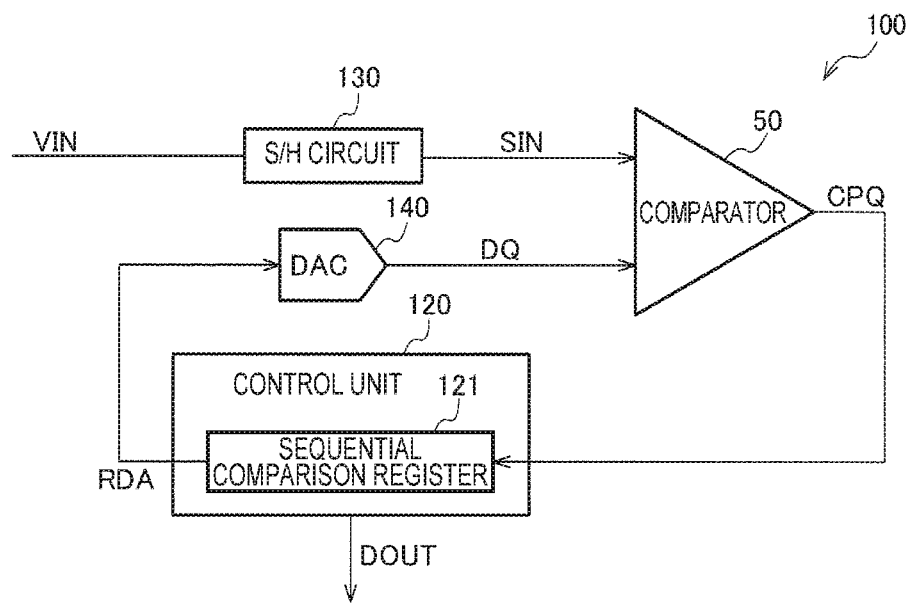
FIG. 18 shows a configuration example of a circuit device.

FIG. 18 is a configuration example of the circuit device 100 including the comparator 50 of the embodiment. Here, a configuration example of a sequential comparison type A/D conversion circuit is illustrated as an example of the circuit device 100. In addition, the circuit device 100 is not limited to this configuration, and may include the comparator 50.

The circuit device 100 includes a comparator 50, a control unit 120 (a control circuit), a sample and hold circuit 130 (an S/H circuit), and a D/A conversion circuit 140 (DAC).

The sample and hold circuit 130 samples and holds the input voltage VIN and outputs the held voltage SIN. The control unit 120 outputs the sequential comparison data RDA stored in the sequential comparison register 121 to the D/A conversion circuit 140. The D/A conversion circuit 140 performs D/A conversion of the sequential comparison data RDA, and outputs the converted voltage DQ. The comparator 50 compares the magnitude relation of the voltage SIN with the magnitude relation of the voltage DQ, and outputs the determination signal CPQ. That is, in FIG. 18, the voltages SIN and DQ correspond to the signals PIN and NIN in FIG. 1 or the like. The control unit 120 updates the sequential comparison data RDA stored in the sequential comparison register 121 based on the determination signal CPQ. The control unit 120 repeatedly updates such sequential comparison data RDA, and outputs finally obtained sequential comparison data RDA as A/D conversion data DOUT.

9. Physical Quantity Sensor

Figure 19:
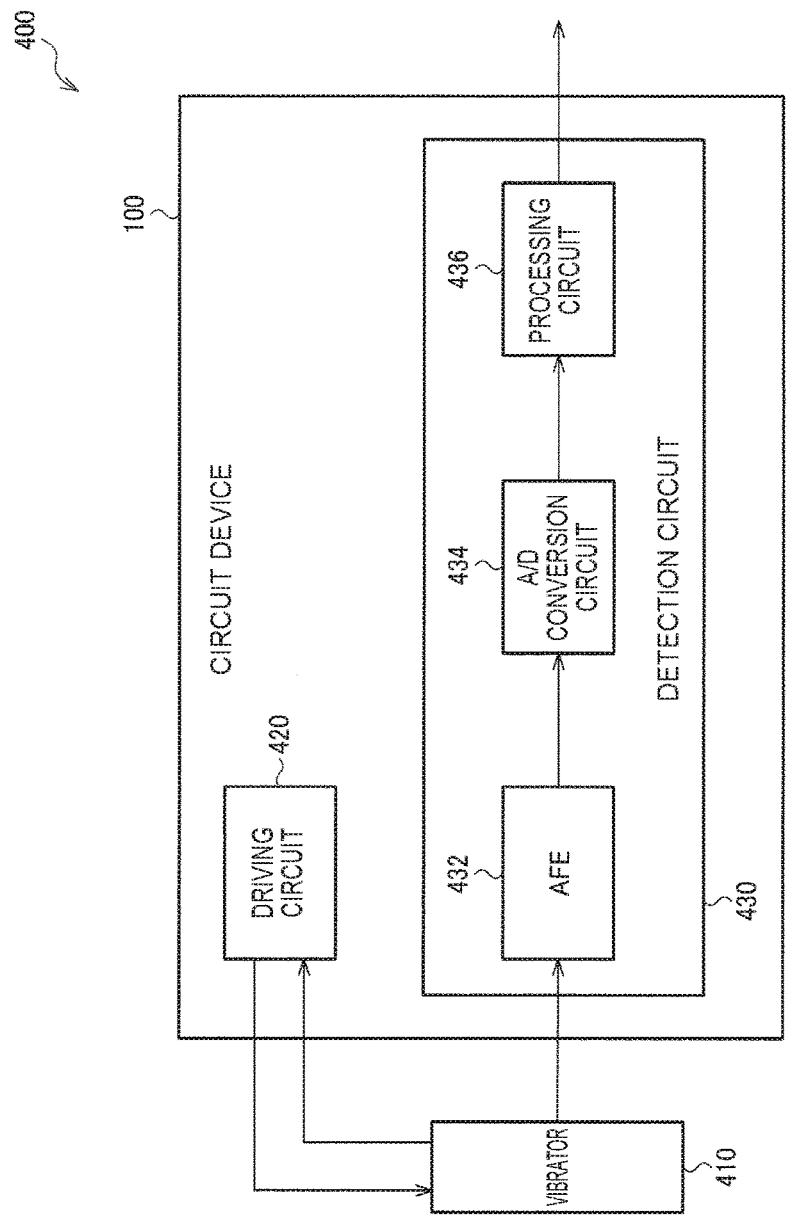
FIG. 19 shows a configuration example of a physical quantity sensor.

FIG. 19 is a configuration example of a physical quantity sensor 400 including the circuit device 100 of the embodiment. Here, a configuration example of a vibration gyro sensor (angular velocity sensor) is illustrated as an example of the physical quantity sensor 400. In addition, the physical quantity sensor 400 is not limited to this configuration, and the circuit device 100 of the embodiment can be applied to various physical quantity sensors such as a capacitance type (silicon MEMS type) gyro sensor, an acceleration sensor, a pressure sensor, and a temperature sensor.

The physical quantity sensor 400 includes a vibrator 410 (for example, a quartz vibrator) which is a detection element that detects the Coriolis force according to an angular velocity, and a circuit device 100 that drives the vibrator 410 and performs a process of detecting the angular velocity.

The circuit device 100 includes a driving circuit 420 and a detection circuit 430. The driving circuit 420 applies a driving signal of a sinusoidal wave or a rectangular wave to a driving vibration portion of the vibrator 410, and automatically adjusts the amplitude of the driving signal constantly based on the feedback signal from the driving vibration portion. The detection circuit 430 includes an analog front end circuit 432 (AFE), an A/D conversion circuit 434, and a processing circuit 436. The analog front end circuit 432 performs charge voltage conversion (Q/V conversion) on the detection signal from the vibrator 410, and synchronously detects the voltage to extract the angular velocity signal. The A/D conversion circuit 434 performs A/D conversion of the angular velocity signal into angular velocity data. The A/D conversion circuit 434 includes the comparator 50 of the embodiment, and corresponds to the sequential comparison type A/D conversion circuit described in FIG. 18. The processing circuit 436 performs various digital signal processes on the angular velocity data, and outputs the processed angular velocity data. For example, a temperature compensation process, a zero point correction process, a digital filter process, or like are performed as digital signal processes.

10. Electronic Device

Figure 20:
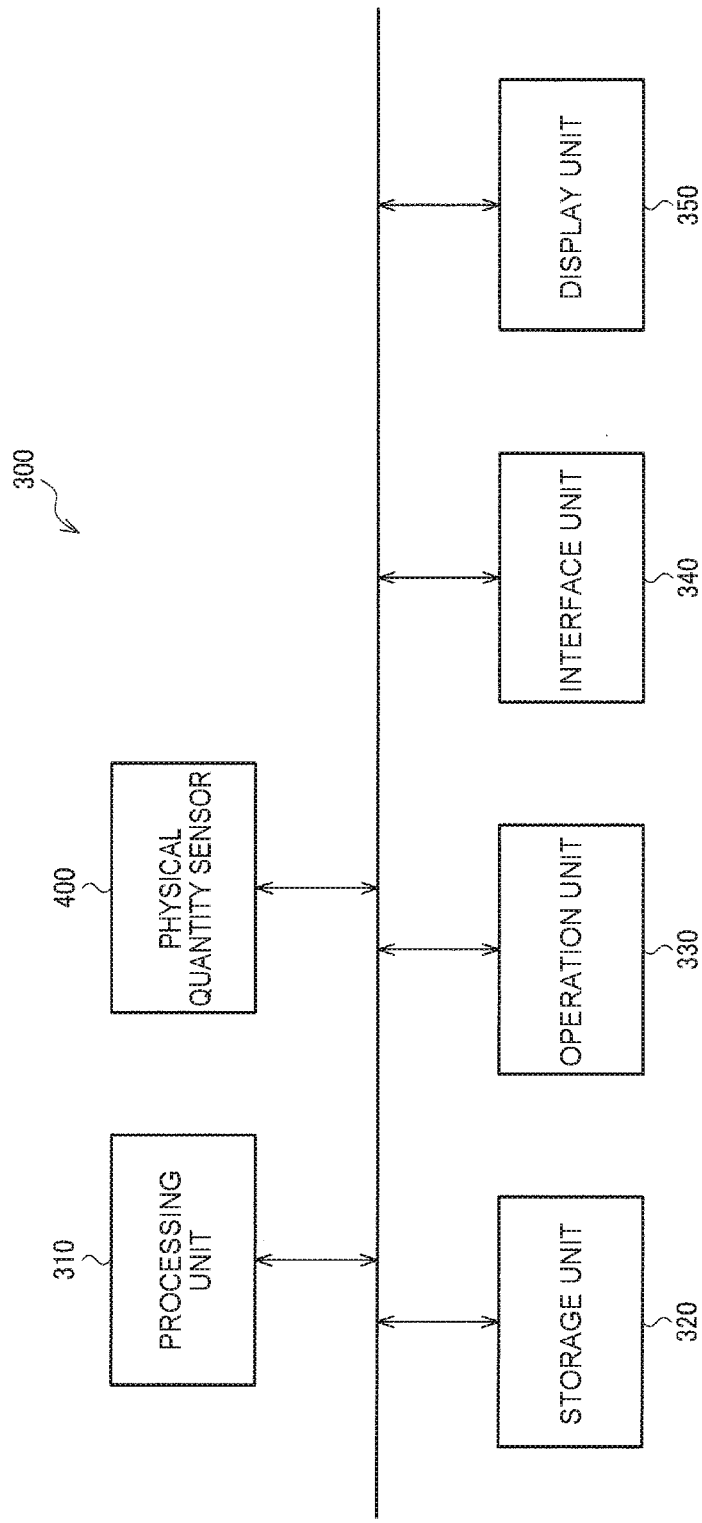
FIG. 20 shows a configuration example of an electronic device.
Figure 21:
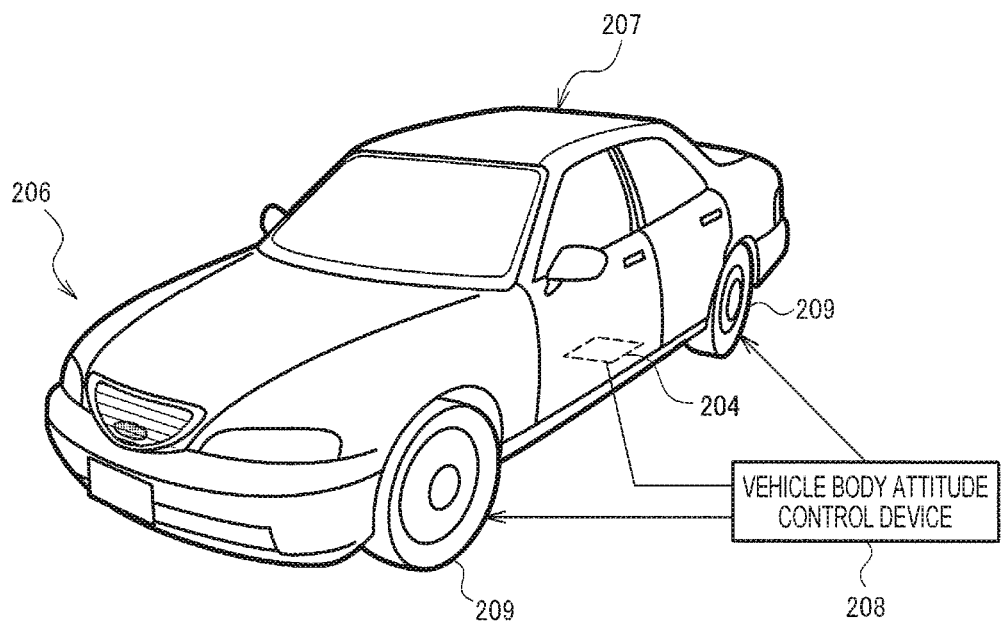
FIG. 21 is a diagram schematically illustrating a vehicle as a specific example of a vehicle.

FIG. 20 and FIG. 21 are examples of an electronic device and a vehicle including the circuit device 100 of the embodiment. The circuit device 100 of the embodiment can be incorporated into, for example, various vehicles such as a car, an airplane, a motorbike, a bicycle, and a ship. A vehicle is, for example, equipment or a device that moves on the ground, the sky or the sea, equipped with a drive mechanism such as an engine or a motor, a steering mechanism such as a steering wheel or a rudder, and various electronic devices.

FIG. 20 is a configuration example of an electronic device 300. A digital still camera, a biometric information detection device (a wearable health device, for example, a pulsimeter, a pedometer, an activity meter, or the like), or a robot (a running robot, or a walking robot) can be assumed as a specific example of the electronic device 300. Here, the case where the electronic device 300 includes the physical quantity sensor 400 is described as an example, but the invention is not limited thereto. That is, the electronic device 300 may include the circuit device 100, and can be applied to various electronic devices in addition thereto.

The electronic device 300 includes a processing unit 310 (for example, a processor such as a CPU or a gate array), a storage unit 320 (for example, a memory, a hard disk, or the like), an operation unit 330 (an operation device), an interface unit 340 (an interface circuit or an interface device), a display unit 350 (display), and a physical quantity sensor 400.

The display unit 350 is, for example, a liquid crystal display device, or an electro-luminescence (EL) display device using a self-luminous element. The operation unit 330 is a user interface that accepts various operations from the user. For example, the operation unit 330 is a button, a mouse, a keyboard, a touch panel mounted on the display unit 350, or the like. The interface unit 340 is a data interface for inputting and outputting image data and control data. For example, the interface unit 340 is a wired communication interface such as USB, or a wireless communication interface such as a wireless LAN. The storage unit 320 stores data input from the interface unit 340. Alternatively, the storage unit 320 functions as a working memory of the processing unit 310. The physical quantity sensor 400 detects, for example, physical amounts such as an angular velocity and an acceleration, and outputs physical quantity data. The processing unit 310 performs a control process of various units in the electronic device and various data processes, based on the physical quantity data from the physical quantity sensor 400.

FIG. 21 is a diagram schematically illustrating a vehicle 206 as a specific example of the vehicle. A gyro sensor 204 (a physical quantity sensor) is incorporated into the vehicle 206. The gyro sensor 204 can detect the attitude of a vehicle body 207. The detection signal of the gyro sensor 204 is supplied to the vehicle body attitude control device 208. The vehicle body attitude control device 208 can control, for example, the hardness of the suspension and control the brakes of the individual wheels 209 according to the attitude of the vehicle body 207. In addition, such attitude control can be used in various vehicles such as a bipedal walking robot, an aircraft, or a helicopter. The gyro sensor 204 can be incorporated to realize attitude control.

Although the above embodiments are described in detail, it will be easily understood by those skilled in the art that many modifications can be made without practically departing from the novel matters and effects of the invention. Accordingly, all such modifications are included in the scope of the invention. For example, in the description or the drawings, the terms described together with the different terms which are broader or synonymous at least once can be replaced with the different terms anywhere in the description or the drawings. Further, all combinations of the embodiments and the modifications are included in the scope of the invention. The configurations and operations of the comparator, the circuit device, the physical quantity sensor, the electronic device, and the vehicle are not limited to those described in the embodiments, and various modifications can be made.

What is claimed is:

1. A comparator comprising:
   a first voltage-time conversion circuit which includes a first delay circuit, the first delay circuit being configured to receive a first input signal and a second input signal;
   a second voltage-time conversion circuit which includes a second delay circuit, the second delay circuit being configured to receive the first input signal and the second input signal; and
   a determination circuit communicating with the first and second voltage-time conversion circuits, the determination circuit being configured to determine a magnitude relation of the first input signal and the second input signal, based on an output signal of the first voltage-time conversion circuit and an output signal of the second voltage-time conversion circuit,
   wherein the first delay circuit includes a first delay unit, the first delay unit including:
      a first primary conductivity type transistor, a current of the first primary conductivity type transistor being controlled based on the first input signal,
      a first secondary conductivity type transistor, a current of the first secondary conductivity type transistor being controlled based on the second input signal, and
      a first delay buffer circuit connected to the first primary conductivity type transistor and the first secondary conductivity type transistor, the first delay buffer circuit being configured to delay an input signal received by the first delay unit and generate a first delayed output signal based on the first input signal and the second input signal, and
   wherein the second delay circuit includes a second delay unit, the second delay unit including:
      a second primary conductivity type transistor, a current of the second primary conductivity type transistor being controlled based on the second input signal,
      a second secondary conductivity type transistor, a current of the second secondary conductivity type transistor being controlled based on the first input signal, and
      a second delay buffer circuit connected to the second primary conductivity type transistor and the second secondary conductivity type transistor, the second delay buffer circuit being configured to delay an input signal received by the second delay unit and generate a second delayed output signal based on the first input signal and the second input signal.

2. The comparator according to claim 1,
   wherein the first delay circuit includes a plurality of the first delay units connected in series; and
   the second delay circuit includes a plurality of the second delay units connected in series.

3. The comparator according to claim 2,
   wherein in the first delay circuit, the first primary conductivity type transistor and the first secondary conductivity type transistor are shared between at least two delay units of the plurality of delay units, and
   wherein in the second delay circuit, the second primary conductivity type transistor and the second secondary conductivity type transistor are shared between at least two delay units of the plurality of delay units.

4. The comparator according to claim 1,
   wherein in a case where a determination result of the determination circuit is confirmed, power supply voltages to be supplied to the first delay buffer circuit and the second delay buffer circuit are set to a predetermined voltage.

5. The comparator according to claim 1,
   wherein a delay time of the first delay buffer circuit is controlled based on a current flowing through any one of the first primary conductivity type transistor and the first secondary conductivity type transistor, and
   wherein a delay time of the second delay buffer circuit is controlled based on a current flowing through any one of the second primary conductivity type transistor and the second secondary conductivity type transistor.

6. The comparator according to claim 1,
   wherein the first voltage-time conversion circuit further includes
      a first input signal generation circuit that generates the input signal received by the first delay circuit, and
      a first latch circuit configured to operate based on an output signal of the first delay circuit, and
   wherein the second voltage-time conversion circuit further includes
      a second input signal generation circuit that generates the input signal received by the second delay circuit, and
      a second latch circuit configured to operate based on an output signal of the second delay circuit.

7. The comparator according to claim 6,
   wherein the first input signal generation circuit is configured to change the input signal input to the first delay unit from a first logic level to a second logic level, and to change the input signal input to the first delay unit from the second logic level to the first logic level, in a case where the output signal of the first delay circuit changes from the first logic level to the second logic level,
   wherein the first latch circuit is configured to change the output signal of the first voltage-time conversion circuit from the second logic level to the first logic level, in a case where the output signal of the first delay circuit changes from the second logic level to the first logic level,
   wherein the second input signal generation circuit is configured to change the input signal input to the second delay unit from the first logic level to the second logic level, and to change the input signal input to the second delay unit from the second logic level to the first logic level, in a case where the output signal of the second delay circuit changes from the first logic level to the second logic level, and
   wherein the second latch circuit is configured to change the output signal of the second voltage-time conversion circuit from the second logic level to the first logic level, in a case where the output signal of the second delay circuit changes from the second logic level to the first logic level.

8. The comparator according to claim 1,
wherein the first voltage-time conversion circuit further includes a first measurement circuit that measures a number of pulses of an output signal from the first delay circuit,
wherein the output signal of the first voltage-time conversion circuit is generated based on a measurement result of the first measurement circuit,
wherein the second voltage-time conversion circuit further includes a second measurement circuit that measures a number of pulses of an output signal from the second delay circuit, and
wherein the output signal of the second voltage-time conversion circuit is generated based on a measurement result of the second measurement circuit.

9. The comparator according to claim 8,
wherein the first voltage-time conversion circuit further includes a first ring oscillator which includes the first delay circuit, and in which the output signal from the first delay circuit is fed back to the input signal received by the first delay unit, and
wherein the second voltage-time conversion circuit further includes a second ring oscillator which includes the second delay circuit, and in which the output signal from the second delay circuit is fed back to the input signal received by the second delay unit.

10. The comparator according to claim 9,
wherein the first voltage-time conversion circuit further includes a third input signal generation circuit that receives an enable signal and a signal based on the output signal from the first delay circuit, and generates the input signal received by the first delay unit, and
wherein the second voltage-time conversion circuit further includes a fourth input signal generation circuit that receives the enable signal and a signal based on the output signal of the second delay circuit, and generates the input signal received by the second delay unit.

11. A circuit device comprising the comparator according to claim 1.

12. A circuit device comprising the comparator according to claim 2.

13. A circuit device comprising the comparator according to claim 3.

14. A circuit device comprising the comparator according to claim 4.

15. A physical quantity sensor comprising the circuit device according to claim 11.

16. A physical quantity sensor comprising the circuit device according to claim 12.

17. An electronic device comprising the circuit device according to claim 11.

18. An electronic device comprising the circuit device according to claim 12.

19. A vehicle comprising the circuit device according to claim 11.

20. A vehicle comprising the circuit device according to claim 12.

* * * * *